US007026825B1

(12) United States Patent
Lo et al.

(10) Patent No.: US 7,026,825 B1
(45) Date of Patent: Apr. 11, 2006

(54) CABLE TESTER

(75) Inventors: William Lo, Cupertino, CA (US); Yiqing Guo, Cupertino, CA (US); Tak Tsui, Sunnyvale, CA (US); Tsin-Ho Leung, San Jose, CA (US); Runsheng He, Sunnyvale, CA (US); Eric Janofsky, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/129,202

(22) Filed: May 13, 2005

Related U.S. Application Data

(60) Division of application No. 10/997,119, filed on Nov. 24, 2004, which is a division of application No. 10/400,367, filed on Mar. 27, 2003, which is a continuation-in-part of application No. 10/331,221, filed on Dec. 30, 2002, which is a continuation-in-part of application No. 10/165,467, filed on Jun. 7, 2002, now Pat. No. 6,825,672.

(51) Int. Cl.
  *G01R 31/02* (2006.01)
(52) U.S. Cl. .................. 324/543; 324/533; 324/534
(58) Field of Classification Search ............. 324/543
  See application file for complete search history.

(56) References Cited

U.S. PATENT DOCUMENTS

| | | | |
|---|---|---|---|
| 4,914,394 A | 4/1990 | Meyer | |
| 5,461,318 A | 10/1995 | Borchert et al. | |
| 6,138,080 A | 10/2000 | Richardson | |
| 6,198,727 B1 | 3/2001 | Wakeley et al. | |
| 6,377,640 B1 | 4/2002 | Trans | |
| 6,434,716 B1 | 8/2002 | Johnson et al. | |
| 6,448,899 B1 | 9/2002 | Thompson | |
| 6,522,152 B1 | 2/2003 | Tonti et al. | |
| 6,535,983 B1 | 3/2003 | McCormack et al. | |
| 6,694,017 B1 | 2/2004 | Takada | |
| 6,728,216 B1 | 4/2004 | Sterner | |
| 6,775,529 B1 | 8/2004 | Roo | |
| 6,829,223 B1 | 12/2004 | Richardson et al. | |
| 2002/0124110 A1 | 9/2002 | Tanaka | |

FOREIGN PATENT DOCUMENTS

| | | |
|---|---|---|
| WO | WO 01/11861 | 2/2001 |
| WO | WO 01/11861 A2 | 2/2001 |

(Continued)

OTHER PUBLICATIONS

U.S. Appl. No. 09/678,728, filed, Oct. 4, 2000.

(Continued)

*Primary Examiner*—Vincent Q. Nguyen
*Assistant Examiner*—Timothy J. Dole

(57) ABSTRACT

A physical layer device includes a cable tester that determines a cable status. A test module transmits a test pulse on the cable, measures reflection amplitude, calculates a cable length, and determines the cable status based on the measured amplitude and the calculated cable length. A first digital signal processor (DSP) communicates with a first pair of the cable and includes a first echo canceller having a finite impulse response (FIR) filter with taps and a first crosstalk canceller having a FIR filter with taps. A second DSP communicates with a second pair of the cable and includes a second echo canceller having a FIR filter with taps and a second crosstalk canceller having a FIR filter with taps. The cable tester calculates a distance to at least one of echo and crosstalk based on values of the taps of the first echo canceller and the second crosstalk canceller.

10 Claims, 30 Drawing Sheets

FOREIGN PATENT DOCUMENTS

WO      WO 01/11861 A3      2/2001

OTHER PUBLICATIONS

U.S. Appl. No. 10/098,865, filed, Mar. 15, 2002.
U.S. Appl. No. 09/991,043, filed Nov. 21, 2001.
Intel, "LXT9784 octal 10/100 Transceiver Hardware Integrity Function Overview", Jan. 2001, pp. 1-14.
IEEE std. 802.3 IEEE Standard for Information Technology—Telecommunications and information exchange between systems—Local and metropolitan area networks—Specific requirements; Part 3: Carrier sense multiple access with collision detection (CSMA/DC)access method and physical layer specifications, 2002, pp. 1-73.
IEEE Computer Society; IEEE Standard 802.3ab; IEEE Std 802.3-2002, IEEE Standard for Information technology—Telecommunications and information exchange betwteen systems—Local and metropolitan area networks—Specific requirements; Part 3: Carrier sense multiple access with collision detection (CSMA/CD) access method and physical layer specifications, Mar. 8, 2002, pp. 147-249.

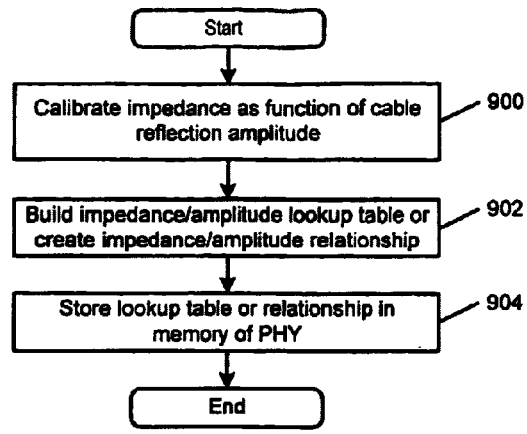
FIG. 30A
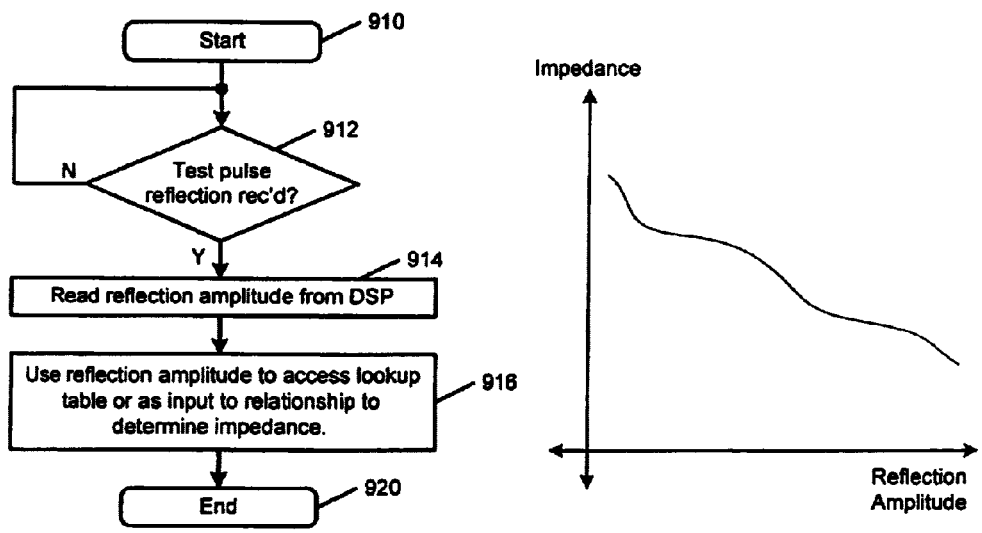
FIG. 31   FIG. 30B

CABLE TESTER

CROSS-REFERENCE TO RELATED APPLICATIONS

This application is a divisional of U.S. patent application Ser. No. 10/997,119 filed Nov. 24, 2004 which is a divisional of U.S. patent application Ser. No. 10/400,367, filed Mar. 27, 2003, which is a continuation-in-part of U.S. patent application Ser. No. 10/331,221, filed Dec. 30, 2002, which is a continuation-in-part of U.S. patent application Ser. No. 10/165,467, filed Jun. 7, 2002 now U.S. Pat. No. 6,825,672. The disclosures of the above applications are incorporated herein by reference in their entirety.

FIELD OF THE INVENTION

The present invention relates to electronic diagnostic systems, and more particularly to testing equipment for cable used in a network.

BACKGROUND OF THE INVENTION

One goal of a network manager is to control total cost of ownership of the network. Cabling problems can cause a significant amount of network downtime and can require troubleshooting resources, which increase the total cost of ownership. Providing tools that help solve cabling problems more quickly will increase network uptime and reduce the total cost ownership.

Referring now to FIG. 1, conventional cable testers 10 are frequently used to isolate cabling problems. The cable testers 10 are coupled by a connector 12 (such as an RJ-45 or other connector) to a cable 14. A connector 15 connects the cable to a load 16. Conventional cable testers typically require the load 16 to be a remote node terminator or a loop back module. Conventional cable tests may generate inaccurate results when the cable is terminated by an active link partner that is generating link pulses during a test. The cable tester 10 performs cable analysis and is able to detect a short, an open, a crossed pair, or a reversed pair. The cable tester 10 can also determine a cable length to a short or open.

A short condition occurs when two or more lines are short-circuited together. An open condition occurs when there is a lack of continuity between ends at both ends of a cable. A crossed pair occurs when a pair communicates with different pins at each end. For example, a first pair communicates with pins 1 and 2 at one end and pins 3 and 6 at the other end. A reversed pair occurs when two ends in a pair are connected to opposite pins at each end of the cable. For example, a line on pin 1 communicates with pin 2 at the other end. A line on pin 2 communicates with pin 1 at the other end.

The cable tester 10 employs time domain reflection (TDR), which is based on transmission line theory, to troubleshoot cable faults. The cable tester 10 transmits a pulse 17 on the cable 14 and measures an elapsed time until a reflection 18 is received. Using the elapsed time and a cable propagation constant, a cable distance can be estimated and a fault can be identified. Two waves propagate through the cable 14. A forward wave propagates from a transmitter in the cable tester 10 towards the load 16 or fault. A return wave propagates from the load 16 or fault to the cable tester 10.

A perfectly terminated line has no attenuation and an impedance that is matched to a source impedance. The load is equal to the line impedance. The return wave is zero for a perfectly terminated line because the load receives all of the forward wave energy. For open circuits, the return wave has an amplitude that is approximately equal to the forward wave. For short circuits, the return wave has a negative amplitude is also approximately equal to the forward wave.

In transmission line theory, a reflection coefficient is defined as:

$$T_L = \frac{R\_wave}{F\_wave} = \frac{V_-}{V_+} = \frac{Z_L - Z_0}{Z_L + Z_0}$$

Where $Z_L$ is the load impedance and $Z_o$ is the cable impedance. The return loss in (dB) is defined as:

$$R_L(db) = 20\text{LOG}_{10}\left|\frac{1}{T_L}\right| = 20\text{LOG}_{10}\left|\frac{Z_L + Z_0}{Z_L - Z_0}\right|$$

Return loss performance is determined by the transmitter return loss, the cable characteristic impedance and return loss, and the receiver return loss. IEEE section 802.3, which is hereby incorporated by reference, specifies receiver and transmitter minimum return loss for various frequencies. Additional factors that may affect the accuracy of the return loss measurement include connectors and patch panels. Cable impedance can also vary, for example CAT5 UTP cable impedance can vary ±15 Ohms.

Consumers can now purchase lower cost switches, routers, network devices and network appliances that include physical layer devices with ports that are connected to cable. When connecting these network devices to cable, the same types of cabling problems that are described above may occur. In these lower cost applications, the consumer typically does not have a cable tester or want to purchase one. Therefore, it is difficult to identify and diagnose cable problems without simply swapping the questionable cable with a purportedly operating cable. If the purportedly operating cable does not actually work, the consumer may incorrectly conclude that the network device is not operating and/or experience further downtime until the cable problem is identified.

SUMMARY OF THE INVENTION

A physical layer device according to the present invention communicates over a cable and includes a cable tester that determines a cable status, which includes an open status, a short status and a normal status. The cable tester includes a pretest module that senses activity on the cable and selectively enables testing based on the sensed activity. A test module is enabled by the pretest module, transmits a test pulse on the cable, measures a reflection amplitude, calculates a cable length, and determines the cable status based on the measured amplitude and the calculated cable length. A digital signal processor (DSP) communicates with the cable and that has a digital gain parameter. A cable length estimator communicates with the DSP and estimates cable length based on the digital gain parameter.

In other features, an indicator displays at least one of the cable status, the estimated cable length, the calculated cable length and the measured reflection amplitude.

A physical layer device according to the present invention communicates over a cable and includes a cable tester that determines a cable status, which includes an open status, a short status and a normal status. The cable tester includes a pretest module that senses activity on the cable and selectively enables testing based on the sensed activity. A test module is enabled by the pretest module, transmits a test pulse on the cable, measures a reflection amplitude, calculates a cable length, and determines the cable status based on the measured amplitude and the calculated cable length. A first digital signal processor (DSP) communicates with a first pair of the cable and includes a first echo canceller and a first finite impulse response filter with first taps. A second DSP communicates with a second pair of the cable and includes a second echo canceller and a second finite impulse response filter with second taps. At least one of the physical layer device and the cable tester estimates skew between the first and second pairs based on values of the first and second taps.

In other features, an indicator displays at least one of the cable status, the estimated skew, the calculated cable length and the measured reflection amplitude.

A physical layer device according to the present invention communicates over a cable and includes a cable tester that determines a cable status, which includes an open status, a short status and a normal status. The cable tester includes a pretest module that senses activity on the cable and selectively enables testing based on the sensed activity. A test module is enabled by the pretest module, transmits a test pulse on the cable, measures a reflection amplitude, calculates a cable length, and determines the cable status based on the measured amplitude and the calculated cable length. A first digital signal processor (DSP) communicates with a first pair of the cable and includes a first echo canceller having a finite impulse response (FIR) filter with taps and a first crosstalk canceller having a FIR filter with taps. A second DSP communicates with a second pair of the cable and includes a second echo canceller having a FIR filter with taps and a second crosstalk canceller having a FIR filter with taps. The cable tester calculates a distance to at least one of echo and crosstalk based on values of the taps of the first echo canceller and the second crosstalk canceller.

In other features, an indicator displays at least one of the status, the echo distance, the crosstalk distance, the calculated cable length and the measured reflection amplitude.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 11 is a functional block diagram of an exemplary network device that includes one or more physical layer devices and that initiates cable testing at power on;

FIG. 30A illustrates steps for calibrating impedance as a function of reflection amplitude;

FIG. 30B is a waveform illustrating impedance as a function of reflection amplitude;

FIG. 31 illustrates steps performed by a cable impedance estimator;

DETAILED DESCRIPTION OF THE PREFERRED EMBODIMENTS

Figure 1:
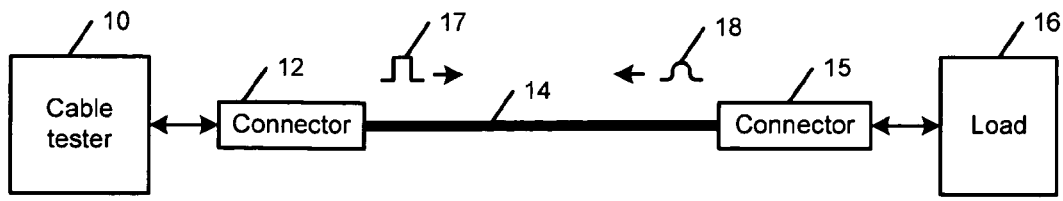
FIG. 1 is a functional block diagram of a cable tester according to the prior art.

The following description of the preferred embodiment(s) is merely exemplary in nature and is in no way intended to limit the invention, its application, or uses. For purposes of clarity, the same reference numbers will be used in the drawings to identify the same elements.

Figure 2:
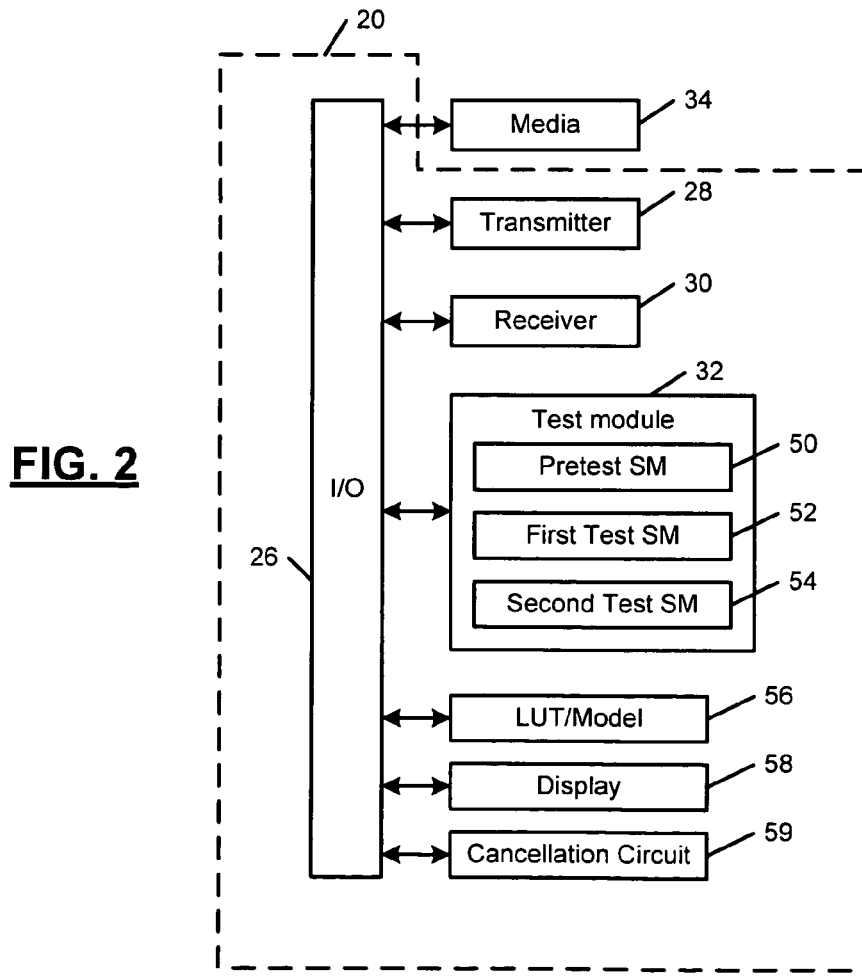
FIG. 2 is a functional block diagram of a cable tester according to the present invention.

Referring now to FIG. 2, a cable tester 20 according to the present invention is shown. The cable tester 20 is capable of testing 10/100BaseT cable, 1000BaseT cable, and/or other cable media. For example, 10/100BaseT includes two pairs of twisted pair wires and 1000BaseT cable includes four pairs of twisted pair wires. A transmitter 28 and a receiver 30 are coupled to the I/O interface 26. A test module 32 includes state machines for testing a media 34 such as cable. The test module 32 can be implemented in combinatorial logic, using discrete circuits, and/or using a processor and memory that executes testing software.

The test module 32 includes a pretest state machine or module 50. The test module 32 also includes a first test state machine or module 52 and/or a second test state machine 54. One or more lookup tables 56 containing cable empirical data are also provided as will be described below. The cable tester 20 may also include a display 58 for presenting fault status, cable length and/or reflection amplitude data. The display 58 can be a graphical user interface (GUI), a light emitting diode (LED) and/or any other type of display. A cancellation circuit 59 cancels the test pulse when testing on media that transmits and receives on the same wire such as 1000BaseT. The cancellation circuit 59 is not used when testing media that transmits and receives on different wires such as in 10/100BaseT. The cancellation circuit 59 can be a hybrid circuit.

Figure 3:
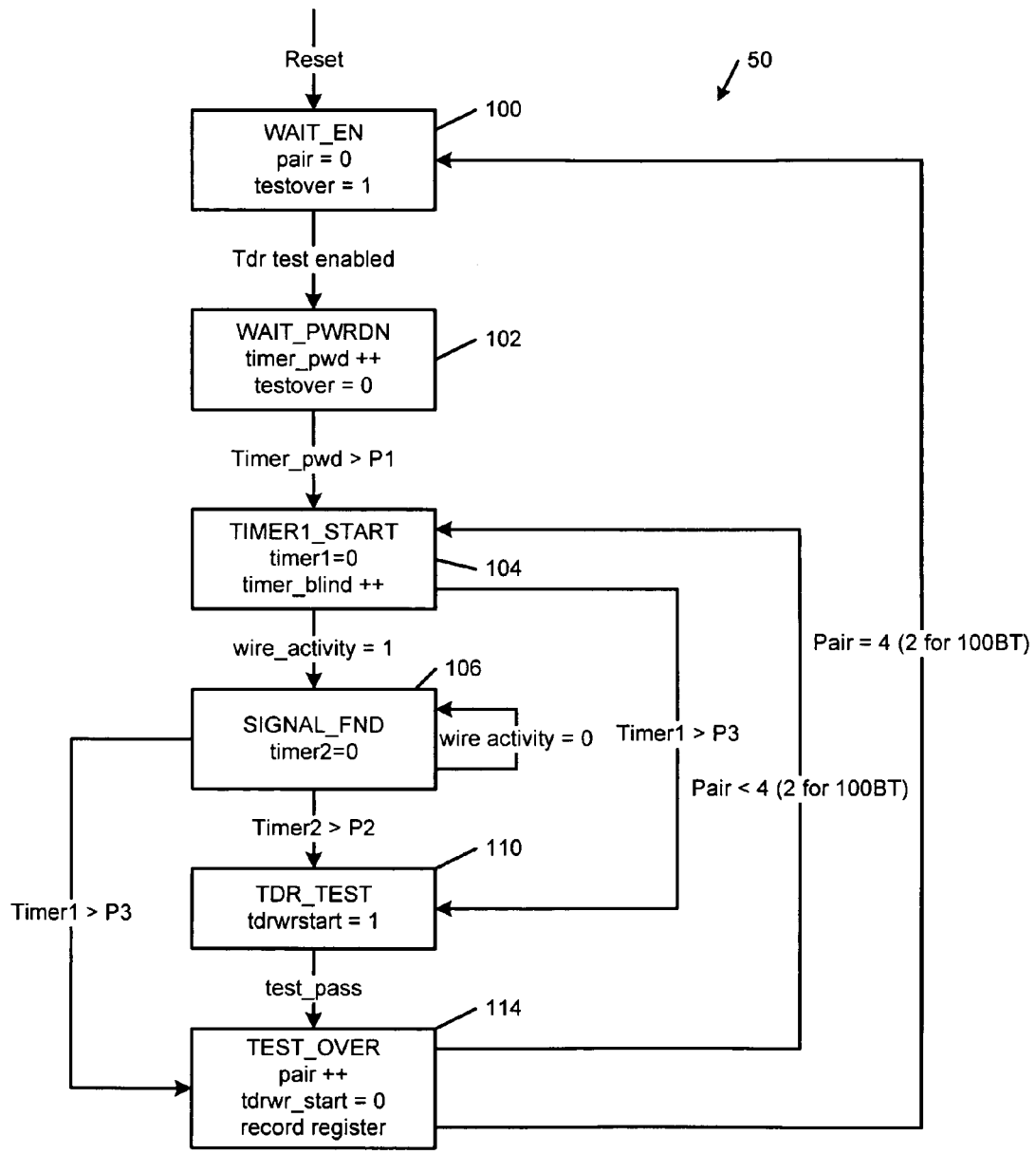
FIG. 3 is a state diagram of a pretest state machine.

Referring now to FIG. 3, the pretest state machine 50 is illustrated in further detail. On reset, the pretest state machine 50 moves to a wait enable state 100. Pair is set equal to zero and testover is set equal to one. When a test enabled signal is received, the pretest state machine 50 transitions to a wait powerdown state 102. A powerdown timer is incremented and testover is set equal to zero. The powerdown timer should have a period that is sufficient to bring a link down. When the powerdown timer exceeds a first period P1, the pretest state machine 50 transitions to a first timer start state 104.

A first timer is set equal to zero and a blind timer is incremented. The blind timer waits for a blind timer period to allow a sufficient amount of time for transitions between pairs. Typically several clock cycles are sufficient. When wire_activity is high, the pretest state machine 50 transitions to a signal find state 106 and resets a second timer. Wire_activity is present when a signal on the wire varies above a predetermined threshold.

When wire_activity is low in the signal find state 106, the pretest state machine 50 transitions back to the signal find state 106 and resets the second timer. If the second timer is greater than a second period P2, the pretest state machine 50 transitions to a test state 110. Tdrwrstart is set equal to one. If a test pass signal is received, the pretest state machine 50 transitions to a test over state 114. Pair is incremented, tdrwrstart is set equal to zero, and the register is recorded.

If pair is less than 4 for 1000BaseT operation or 2 for 10/100BaseT operation, the pretest state machine 50 transitions from the test over state 114 to the first timer start state 104. If pair is equal to 4 for 1000BaseT operation or 2 for 10/100BaseT operation, the pretest state machine 50 transitions from the test over state 114 to the wait enable state 100.

In the first timer start state 104, the pretest state machine 50 transitions to the test state 110 if the first timer is greater than a third period P3. In the signal find state 106, the pretest state machine 50 transitions to the test over state 114 if the first timer is greater than the third period P3.

In a preferred embodiment, the first period P1 is preferably 1.5 s, the second period P2 is equal to 5 ms, and the third period is equal to 625 ms. Skilled artisans will appreciate that the first, second and third periods P1, P2 and P3, respectively, may be varied. The P3 is preferably selected based on a worst case spacing of link pulses and a longest duration between MDI/MDIX crossover. P2 is preferably selected to allow testing between fast link pulses (FLP). FLP bursts have a length of 2 ms and a spacing of 16 ms. By setting P2=5 ms, the delay is a total of 7 ms, which is approximately half way between FLPs. P1 may be longer than 1.5 seconds if required to bring the link down.

Figure 4:
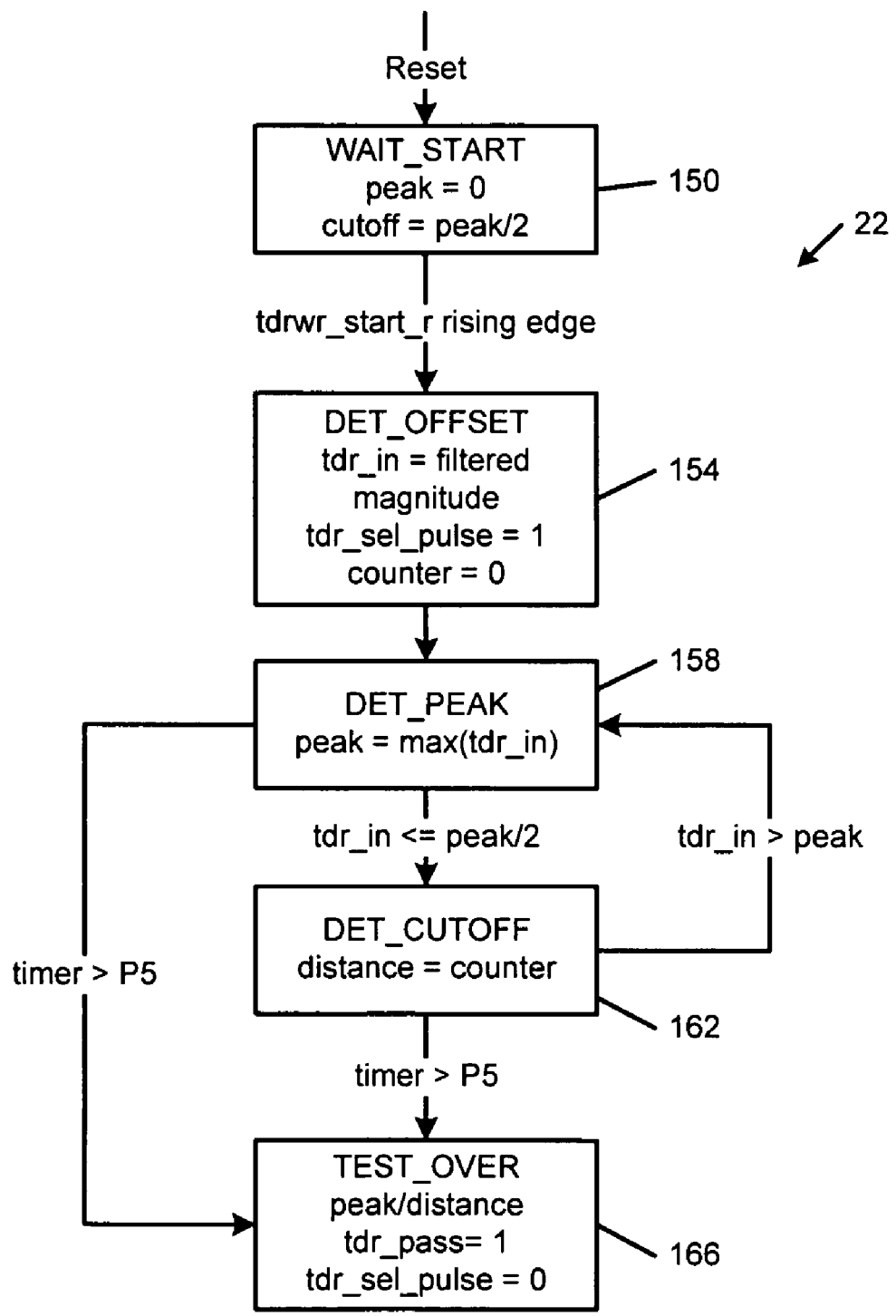
FIG. 4 is a state diagram of a first test state machine for a cable tester for a media that transmits and receives on the same wire.

Referring now to FIG. 4, the first test state machine 52 for media that transmits and receives on the same wire is shown. The cancellation circuit 59 cancels the transmit test pulse. On reset, the first test state machine 52 transitions to a wait start state 150. Peak is set equal to zero and cutoff is set equal to peak/2. When tdrwr_start_r rising edge is received from the pretest state machine 50, the first test state machine 52 transitions to a detect offset ostate 154. tdr_sel_pulse is set equal to 1 to generate a pulse and start a timer. The pulse is preferably a 128 ns pulse having a 2V amplitude.

After an offset is subtracted from tdr_in, the first test state machine 52 transitions to a detect peak state 158. Peak stores the current value of tdr_in. If tdr_in is less than or equal to peak/2, the first test state machine 52 transitions to a detect cutoff state 162 where distance is set equal to a counter. If tdr_in is greater than peak, the first test state machine 52 transitions to state 158 and peak is replaced by a new tdr_in. If a timer is greater than a fifth period P5, the first test state machine 52 transitions to a test over state 166 where peak/distance is calculated, tdr_pass is set equal to 1, and tdr_sel_pulse is set equal to 0.

While in the detect cutoff state 162, the first test state machine 52 transitions to the detect peak state 158 if tdr_in >peak. While in the detect peak state 158, the first state machine 52 transitions to the test over state 166 if the timer is greater than the fifth period P5. In a preferred embodiment, P5 is equal to 5 μs.

Figure 5:
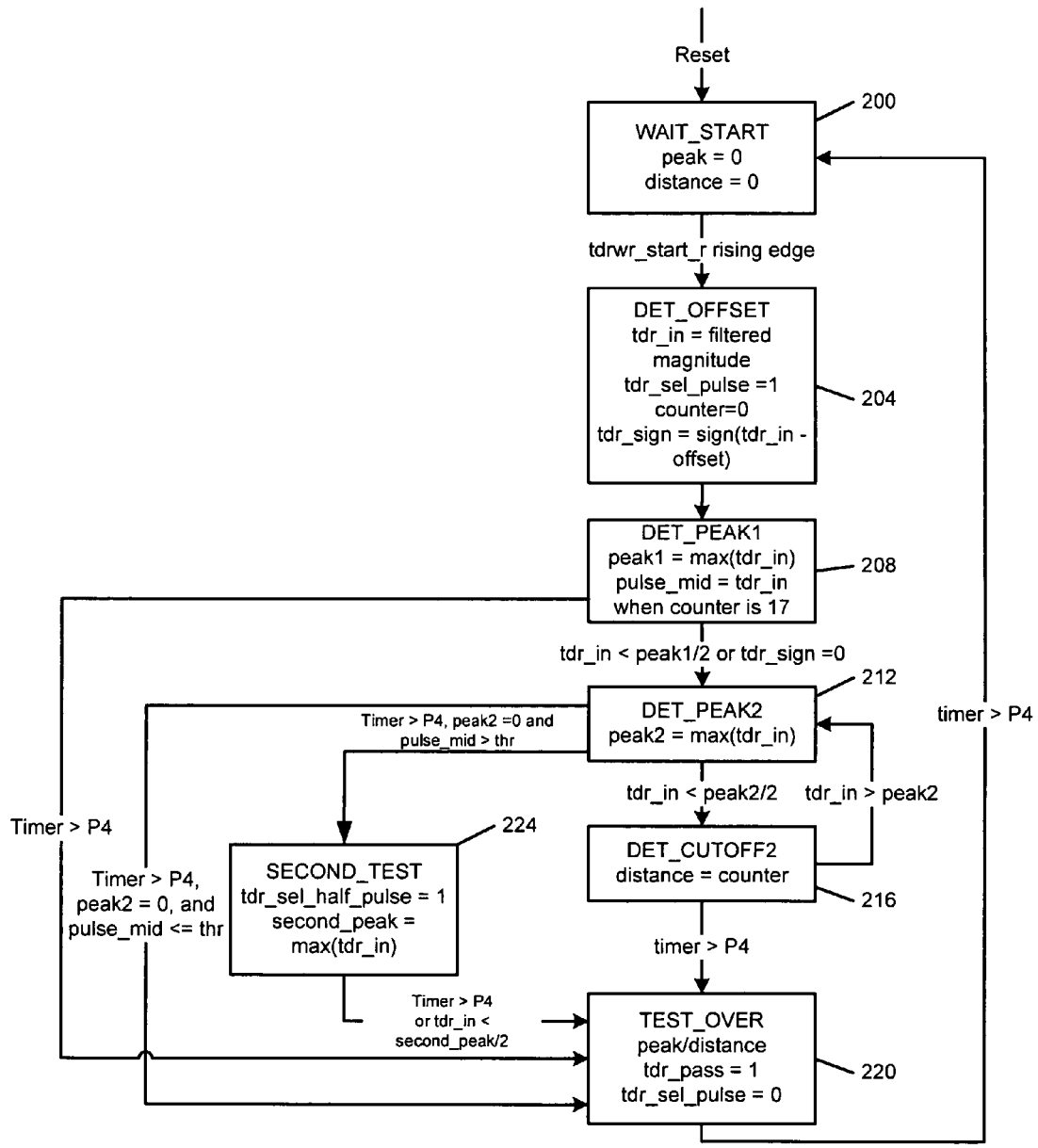
FIG. 5 is a state diagram of a second test state machine for a cable tester for a media that does not transmit and receive on the same wire.

Referring now to FIG. 5, the second test state machine 54 is shown in further detail. On reset, the second test state machine 54 transitions to a wait start state 200. Peak is set equal to zero, cutoff is set equal to peak/2, and distance is set equal to 0. When tdrwr_start_r rising edge is received from the pretest state machine 50, the second test state machine 54 transitions to a detect offset state 204 where tdr_in =filtered magnitude and tdr_sel_pulse is set equal to 1 and tdr_sign is set to 1 if ADC input is greater than or equal to offset, 0 otherwise. The second test state machine 54 transitions to a first detect peak state 208 where peak1 is set equal to maximum of tdr_in and pulse_mid is set equal to tdr_in after 17 clock cycles.

If tdr_in is less than peak1/2 or tdr_sign is set equal to 0, the second test state machine 54 transitions to a second detect peak state 212 and sets peak2 equal to maximum of tdr_in. If tdr_in is less than peak2/2, the second test state machine 54 transitions to a detect cutoff state 216. Distance is set equal to a counter. If a fourth timer is greater than a fourth period P4, the second test state machine 54 transitions to a test over state 220. Peak/distance is calculated, tdr_pass is set equal to 1, and tdr_sel_pulse is set equal to 0.

In the detect cutoff state 216, if tdr_in is greater than peak2, the second test state machine 54 transitions to the second peak detect state 212. In the second detect peak state 212, if the fourth timer is greater than P4, peak2 is equal to 0 and pulse_mid is greater than a threshold, the second test state machine 54 transitions to a second test state 224. In the second test state 224, tdr_sel_half_pulse is set equal to 1 to send a half pulse and the fourth timer is restarted and incremented and second_peak is set to a maximum of tdr_in. The second test state machine 54 transitions from the second test state 224 to the test over state 220 if the fourth timer is greater than P4 or tdr_in is less than second_peak/2.

In the first detect peak state 208, if the fourth timer is greater than P4, the second test state machine 54 transitions to the test over state 220. In the second detect peak state 212, if the fourth timer is greater than P4, peak2=0, and pulse_mid is less than or equal to a second threshold, the second test state machine 54 transitions to the test over state 220.

The link is brought down and the pretest state machine 50 waits until the line is quiet. For each pair, the cable tester 20 generates a TDR pulse and measures the reflection. In 10/100BaseT media, after the test is enabled, the pretest state machine 50 waits until the line is quiet. A pulse is generated and the reflection is measured. The status receiver and transmitter pairs are determined sequentially. For the first pair, the receiver is preferably in MDIX mode and the transmitter is preferably in MDI mode. For the second pair, the receiver is preferably in MDI mode and transmitter is preferably in MDIX mode.

The pretest state machine 50 ensures that the line is quiet before the pulse is transmitted. After the test is enabled, the pretest state machine 50 waits P1 (such as 1.5 seconds or longer) to make sure that the link is brought down. The pretest state machine 50 determines whether there is activity on a first pair (MDI+/−[0] for 1000BaseT network devices and TX for 10/10BaseT products).

In a preferred embodiment, activity is found when activity minus systemic offset such as a noise floor that is calculated in states 154 and 204 is greater than a predetermined threshold. If there is no activity for P3 (such as 625 ms), the pretest state machine 50 proceeds to the test state and sends a pulse on the selected pair. If there is activity on the pair and the line is quiet for 5 ms afterwards, the pretest state machine proceeds to the test state. The test fail state is reached and a test failure declared if the line has not been quiet for more than P2 (such as 5 ms) during P3 (such as 625 ms). If a test failure is declared on the first pair or the TDR test is completed for the pair, the same procedure is conducted on MDI+/−[1], MDI+/−[2], MDI+/−[3] sequentially for 1000BaseT devices and the RX pair for 10/10BaseT devices.

In 1000BaseT devices, the original 128 ns test pulse is cancelled by the cancellation circuit 59. The pulse received at the ADC output is the reflection. The test pulse preferably has 2V swing. Before testing, the offset on the line is measured and is subtracted from the received ADC value.

Figure 6:
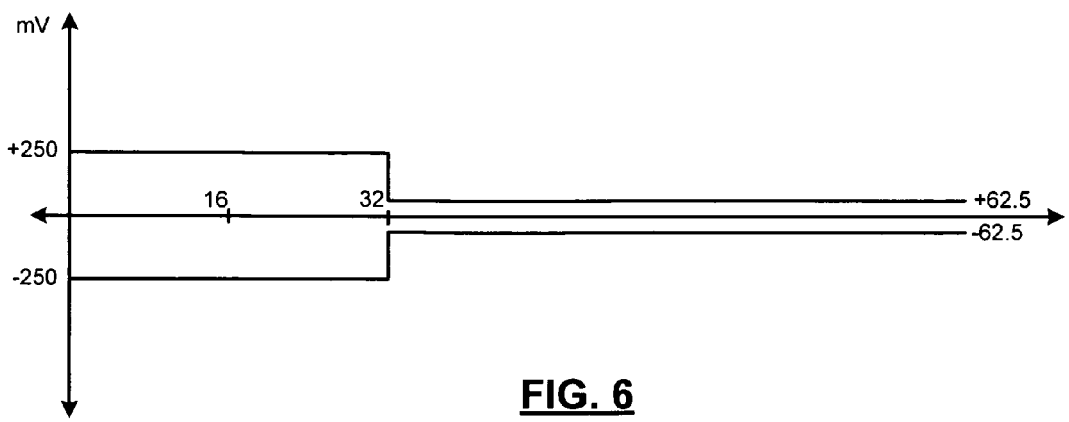
FIG. 6 is a waveform diagram illustrating a time-based receiver floor.
Figure 7:
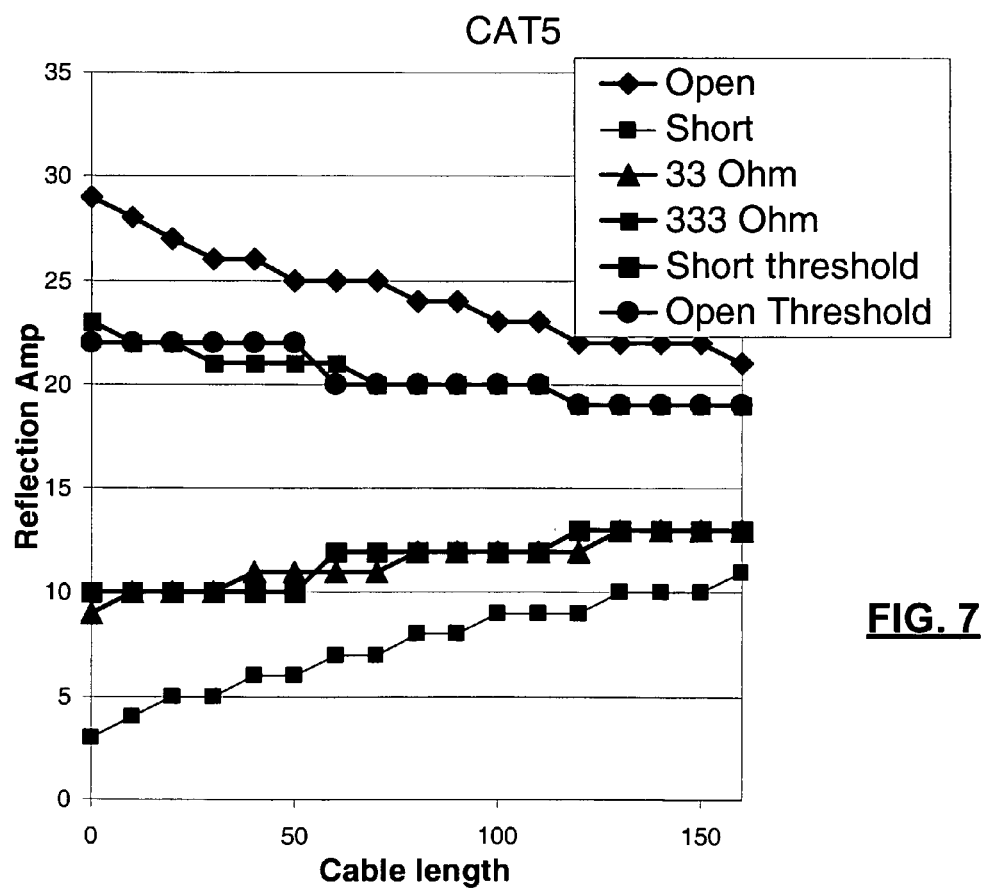
FIG. 7 is an exemplary cable reflection amplitude vs. cable length relationship for a first type of cable.

Referring now to FIG. 6, the cancellation circuit 59, which can be an analog hybrid circuit, does not perfectly cancel the test pulse. To prevent false reflection identification, a 250 mv floor within 32 clock cycles (125 Mhz clock) and a 62.5 mv floor after 32 clock cycles are used to allow a residual of cancellation of the test pulse and noise to be filtered. The peak value on the line is detected for 5 μs. The amplitude of reflection is the maximum magnitude that is detected. The amplitude is adjusted according to the sign of the reflection. The distance to the reflection is located at 50% of the peak.

The cable status is determined by comparing the amplitude and the calculated cable length to the lookup table 56 for the type of cable being tested. The measured reflection amplitude falls into a window. There are two adjustable thresholds for open circuit and short circuit cable. The open threshold is preferably based on experimental data, which can be produced by refection amplitudes for CAT3 and CAT5 cable that is terminated with a first impedance value such as 333 Ohms.

The default short circuit threshold is based on experimental data of refection amplitudes for CAT3 and CAT5 cable that is terminated with a second impedance value such as a 33 Ohms. As can be appreciated, the lookup table 56 may contain data for other cable types. Other impedance values may be used to generate the thresholds.

If measured amplitude falls between open and short circuit thresholds, the cable status is declared normal. If the amplitude is above the open threshold, the cable status is declared an open circuit. If the amplitude is below a short circuit threshold, the cable status is declared a short circuit. The cable status, reflection amplitude and cable distance are stored and/or displayed.

In the second test state machine, the original test pulse is not cancelled. Both the original pulse and the reflection are monitored. When an open circuit is located near the cable tester, the two pulses may be overlapping, which may cause saturation in the ADC. The test state machine preferably sends out a 128 ns pulse that has a 1 V swing. The offset on the line is measured and subtracted from the received ADC value. A 250 mv floor is used within 32 clock cycles (125 Mhz clock) and a 62.5 mv floor is used after 32 clock cycles so that the residual of cancellation and noise can be filtered. Signals below the floor are considered to be 0. The peak value on the line is detected for 5 μs. As can be appreciated, the test pulse can have longer or shorter durations and amplitudes.

The first peak that is observed should be the test pulse. The amplitude of reflection is the maximum magnitude detected after the test pulse is detected. The distance of reflection is at 50% cutoff of the peak. If another pulse is not detected after the test pulse and the magnitude of the test pulse when the counter 17 reaches a preset threshold, is greater than a preset threshold, the cable tester decides whether there is an open cable that is located relatively close or a perfectly terminated cable by sending a second test pulse that has one-half of the magnitude of the first test pulse.

If the maximum magnitude on the line is greater than ¾ of the original pulse, there is an open circuit that is located relatively close. Otherwise, if the first peak is detected after a predetermined number of clock cycles, the cable tester 20 declares an open circuit. If the first peak is within after the predetermined number of clock cycles, the cable tester 20 declares a perfectly terminated cable. In one exemplary embodiment, the predetermined number of clock cycles is 33.

The cable status is determined by comparing the amplitude and distance of reflection to the lookup table 56 based on the type of cable being tested. There are two adjustable thresholds for open and short circuit cable. The default open threshold is from the experimental data of refection amplitudes for CAT3 and CAT5 cable terminated with a first impedance value such as 333 Ohms. The default short circuit threshold is from the experimental data of refection amplitude of CAT3 and CAT5 cable that is terminated with a second impedance value such as 33 Ohms. Other impedance values may be employed for generating thresholds.

If the measured amplitude falls between open and short circuit thresholds, the cable status is declared normal. If the amplitude is above the open circuit threshold, the cable status is declared an open circuit. If the amplitude is below a short circuit threshold, the cable status is declared a short circuit. The cable status, reflection amplitude and cable length are stored and/or displayed.

Figure 8:
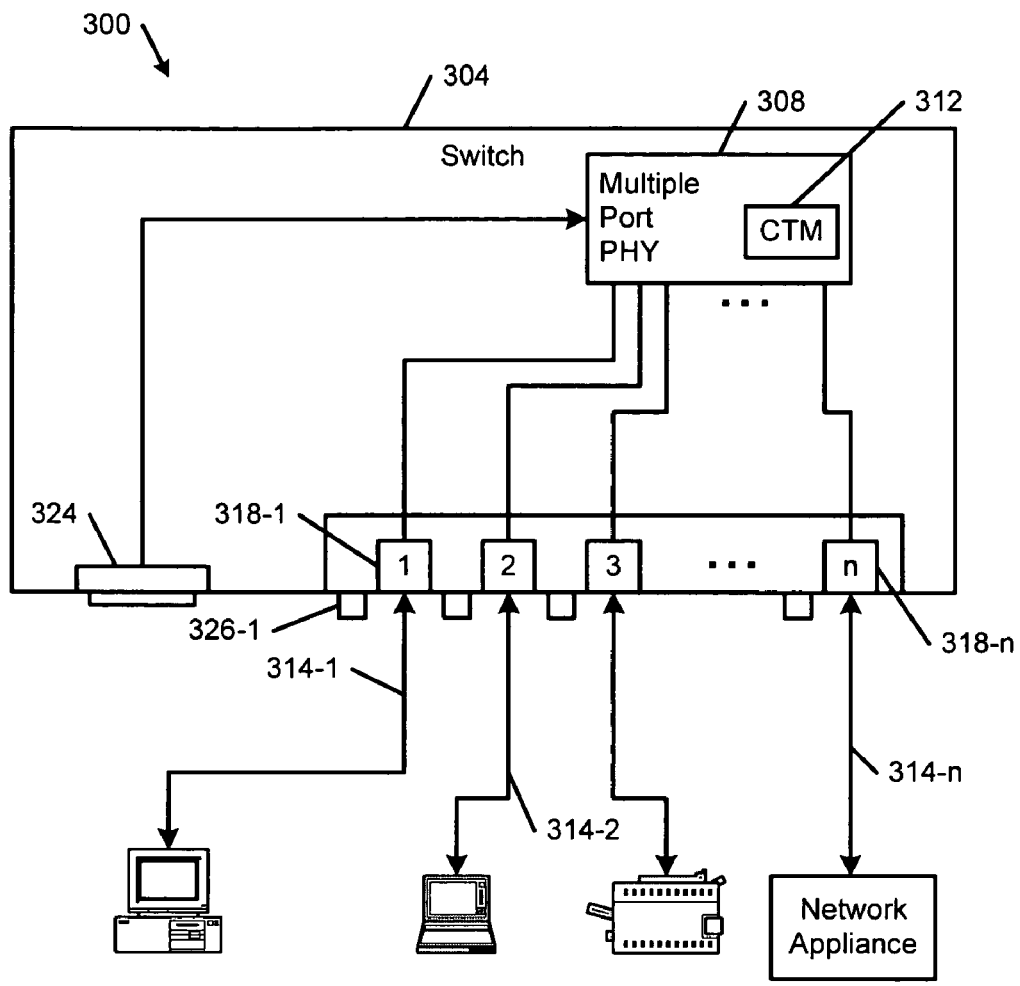
FIG. 8 is a functional block diagram of an exemplary network device that includes one or more physical layer devices and that includes a hardware or software based cable testing switch for initiating cable testing.

Referring now to FIG. 8, the cable tester can be implemented in an exemplary network device 300 that includes a physical layer device 308 and a cable tester or cable test module (CTM) 312, as described above. The network device 300 can be a switch 304 that includes an n port physical layer device 308 and a cable test module (CTM) 312. While the switch 304 is shown, any other network device 300 that contains a physical layer device, a port and the CTM can be used. For example, the network device 300 may be a network appliance, a computer, a switch, a router, a fax machine, a telephone, a laptop, etc.

Cables 314-1, 314-2, . . . , and 314-n can be connected to the switch 304 using connectors 318-1, 318-2, . . . , and 318-n, such as RJ-45 connectors or any other suitable connector type. The switch 304 can be connected to other network devices such as, but not limited to, computers, laptops, printers, fax machines, telephones and any other network device or network appliance.

In the embodiment shown in FIG. 8, the network device 300 includes a software or hardware based switch 324 that is used to trigger the cable test during operation. The network device 300 also includes one or more light emitting diodes (LEDs) 326-1, 326-2, . . . , and 326-n. If a single LED per port is used, the LEDs 326 are fully burdened during normal use. For example, the LEDs 326 are used to display the presence or absence of a link, link speed, link activity and other information during normal (non-cable-testing) use. While LEDs are shown, any other audio and/or visual indicator can be used. For example, audible tones from a speaker or other audio device can be used to indicate cable status. If the network device includes illuminated switches, the illumination of the switches can be flashed, brightened, dimmed or otherwise used to indicate cable status. Still other indicators include incandescent lights.

Figure 9:
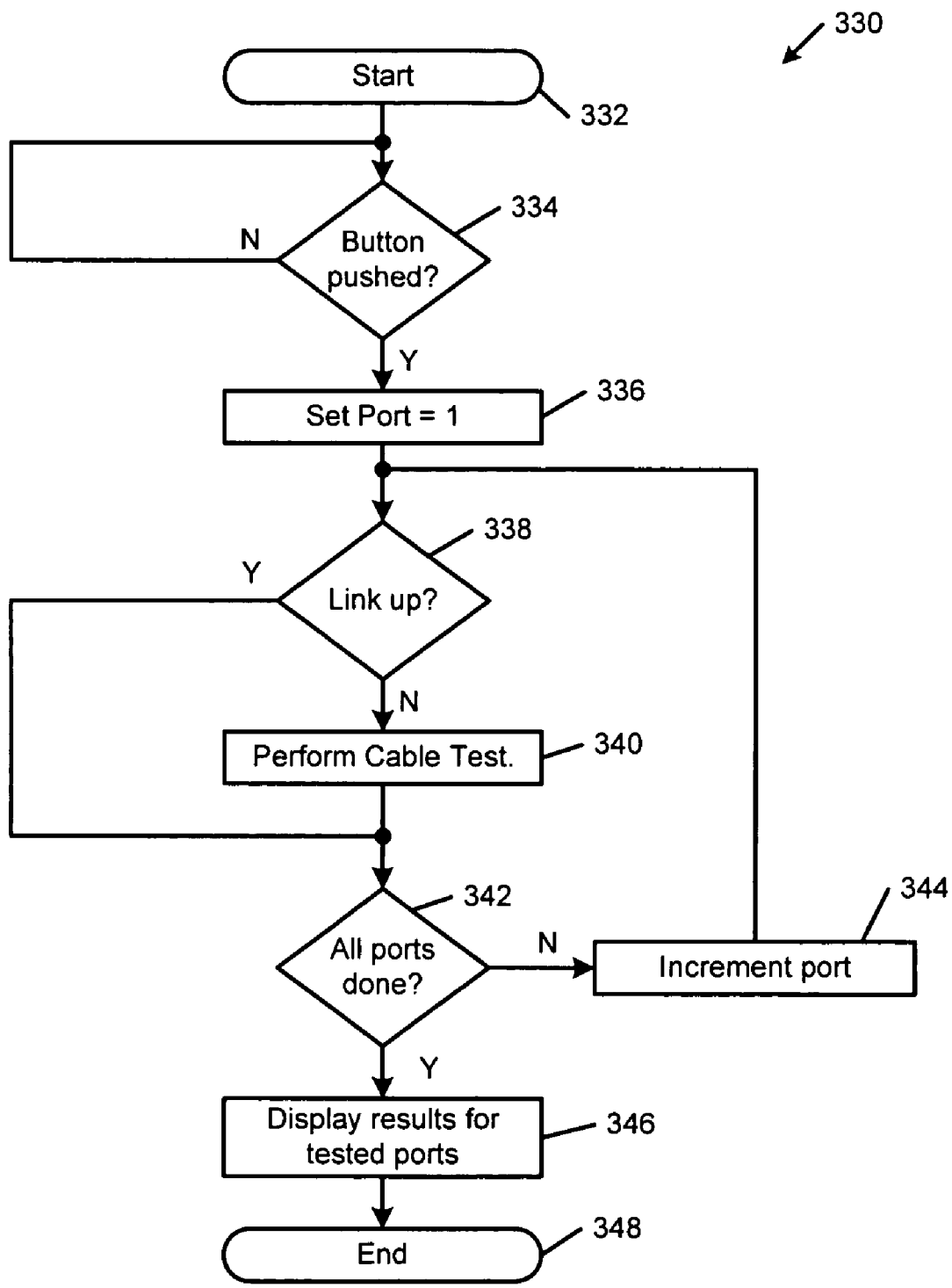
FIG. 9 is a flowchart illustrating steps for performing a cable test for the exemplary network device in FIG. 8.

Referring now to FIG. 9, steps for operating the network device 300 are shown generally at 330. Control begins with step 332. In step 334, control determines whether the test switch 324 has been pushed. If the test switch has not been pushed, control loops back to step 334. Otherwise, control continues with step 336 where control sets the port equal to 1.

Control determines whether the link associated with a current port is up in step 338. If not, control performs the cable test on the designated port in step 340. Control continues from step 340 or step 338 (if true) with step 342 where control determines whether all ports have been tested. For example, the cable may include four ports that are associated with four pairs of twisted wire, although additional or fewer ports and pairs can be used. If not, control continues with step 344, increments the port, and continues with step 338. If all ports are tested as determined in step 342, control displays the results for the tested port(s) in step 346 using the LEDs and control ends in step 348. If the network device 300 has only one port, steps 336, 342 and 344 can be skipped. As can be appreciated by skilled artisans, the cable test can be executed sequentially for each port as set forth above or simultaneously for all ports. For simultaneous operation, additional cable test modules or portions thereof may need to be duplicated.

Figure 10A:
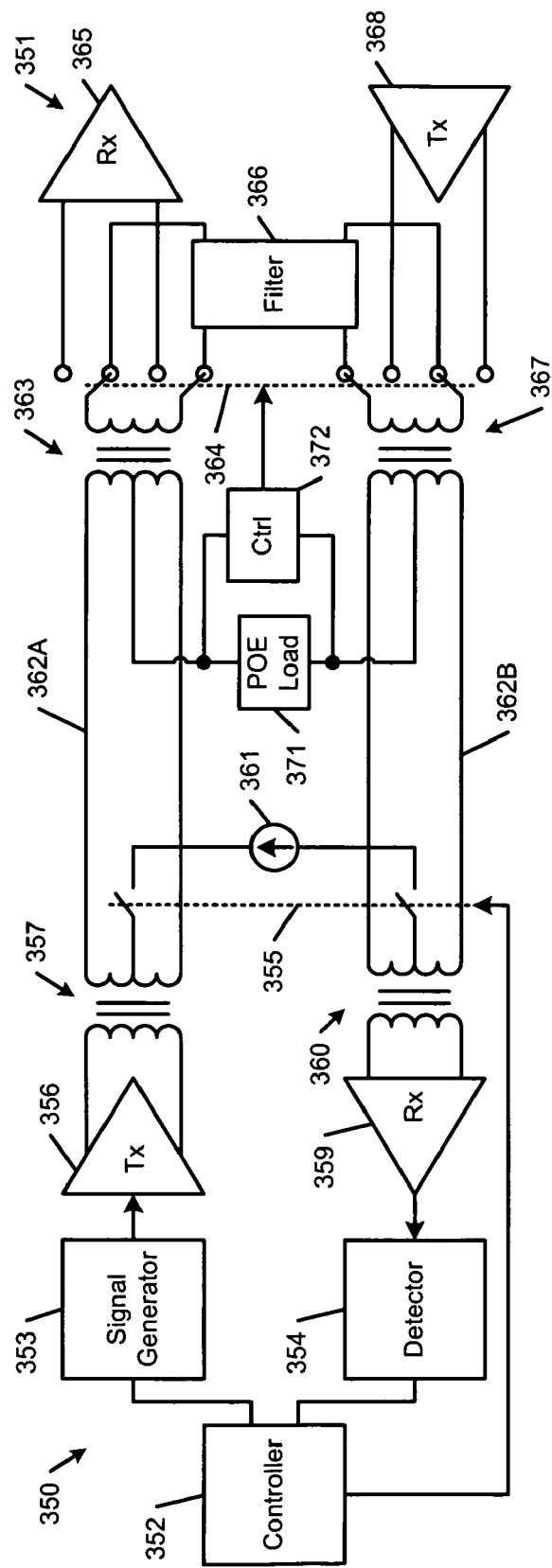
FIG. 10A is a functional block diagram of an exemplary power over Ethernet (POE) device.
Figure 10B:
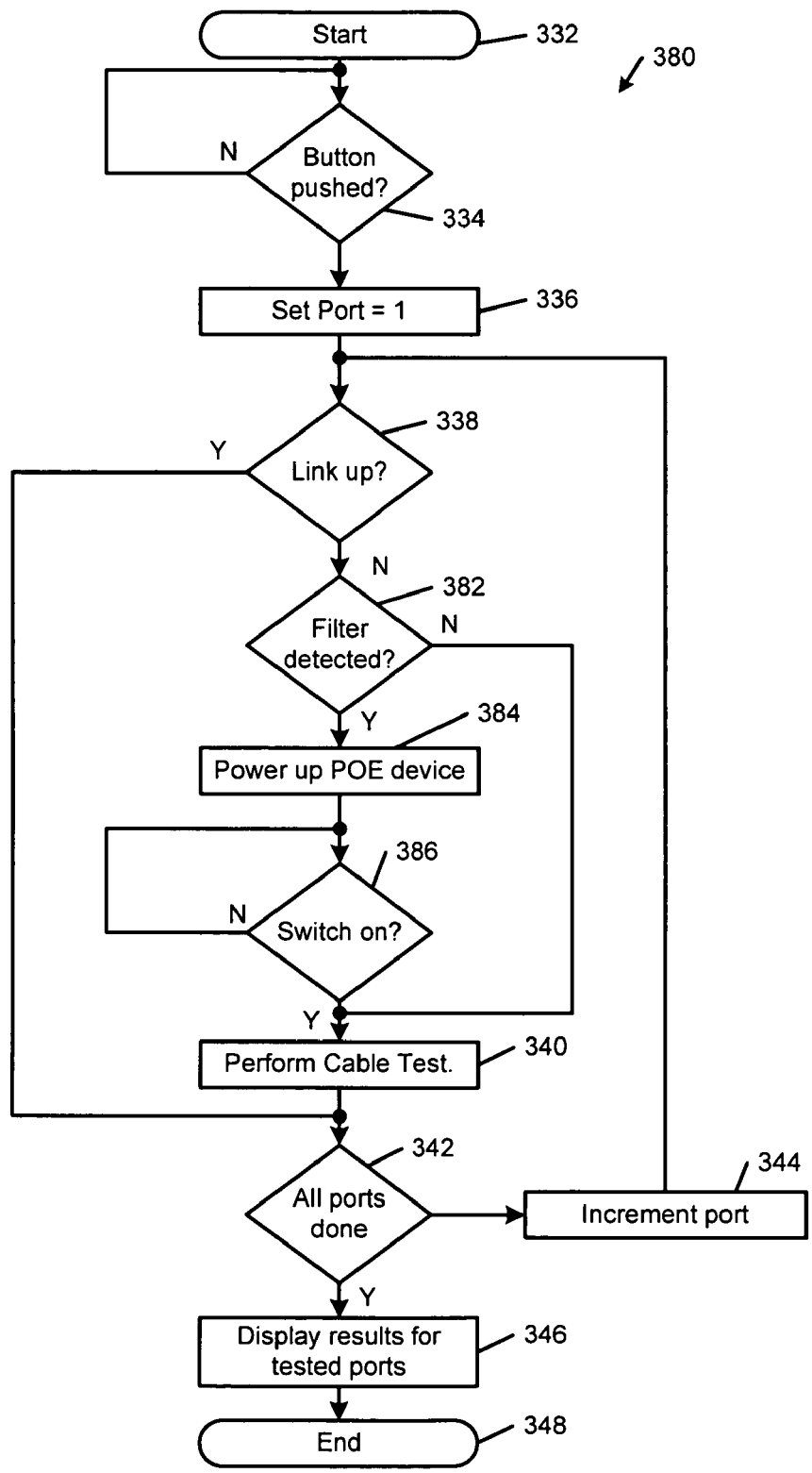
FIG. 10B is a flowchart illustrating steps for performing a cable test for the exemplary network device in FIG. 8 when POE devices are possibly connected at remote cable ends.

Referring now to FIGS. 10A and 10B, additional steps are performed when the network device may be connected to power over Ethernet (POE) devices or data terminal equipment (DTE), which will be collectively referred to herein as POEs. Examples of POEs include computers (notebooks, servers and laptops), equipment such as smart videocassette recorders, IP telephones, fax machines, modems, televisions, stereos, hand-held devices, or any other network device requiring power to be supplied over the cable. These devices typically include a filter or other circuit that is connected across center taps of transformers at the POE end of the cable. If not accommodated by the cable test module, the filters or other circuits that are used by the POEs may cause the cable test to generate inaccurate results.

Referring now to FIG. 10A, an exemplary network device 350 provides cable power to an exemplary cable-powered POE 351. The network device 350 includes a controller 352 that communicates with a signal generator 353, a detector 354 and a selector switch 355. The signal generator 353 communicates with a transmitter 356 having an output that communicates with a secondary of a transformer 357. The detector 354 communicates with a receiver 359 having an input that communicates with a secondary of a transformer 360. The selector switch 355 selectively connects center taps of primaries of the transformers 357 and 360 to a power source 361.

Pair A of a cable 362 communicates with a primary of a transformer 363. A secondary of the transformer 363 communicates with a selector switch 364, which selects either a receiver 365 or a filter 366. Pair B of the cable 362 communicates with a primary of a transformer 367. A secondary of the transformer 367 communicates with the selector switch 364, which selects either the transmitter 368 or the filter 366.

A load 371 and a controller 372 are connected across center taps of the primaries of the transformers 363 and 367. The load 371 includes, for example, the load of the receiver 365, the transmitter 368 and other circuits in the cable-powered POE device 351. The controller 372 controls the position of the selector switch 364. In a de-energized state or when power is not supplied over data the cable 362, the selector switch 364 connects the secondaries of the transformer 363 and 367 to the filter 366. Typically the filter 366 is a low-pass filter.

The controller 372 detects when the network device 350 supplies power to the cable 362. Since the load 371 is in parallel with the controller 372, power is also supplied to the load 371 at the same time as power is supplied to the controller 372. When power is supplied to the controller 372, the selector 364 is controlled to connect the secondary of the transformer 363 to the receiver 365 and the secondary of transformer 367 to the transmitter 368. At substantially the same time, power is supplied to the receiver 365, the transmitter 368 and the other circuits of cable-powered POE device 351. At this point, the cable-powered POE device 351 can begin autonegotiating with the network device 350.

The cutoff frequency of the low-pass filter 366 filters out fast link pulses (FLPs). Without the filter 366, when the POE 351 communicates with a non-POE enabled network device, the FLPs generated by the non-POE network device could be sent back to the non-POE network device. The non-POE network device may receive the FLPs that it sent and attempt to establish a link with itself or cause other problems. The filter 366 will also adversely impact the cable test. Thus, the network device 350 transmits test signals having pulse widths greater than FLPs, which will pass through the low-pass filter 352. Once the selector switch closes, the network device 350 performs cable testing.

For additional details concerning these and other POE devices, see "Method and Apparatus for Detecting and Supplying Power by a First Network Device to a Second Network Device", U.S. patent application Ser. No. 10/098, 865, filed Mar. 15, 2002, and "System and Method for Detecting A Device Requiring Power", WO 01/11861, filed Aug. 11, 2000, which are both incorporated by reference in their entirety.

Referring now to FIG. 10B, steps for performing the cable test when the network device may be connected to POE devices are shown generally at 380. Common steps from FIG. 9 have been identified using the same reference number. If the link is not up in step 338, control continues with step 382 where control determines whether the filter 366 is detected. Is false, control continues with step 340 as described above. If the filter 366 is detected, control powers up the POE device in step 384. In step 386, control determines whether the selector switch 355 is on. If not, control loops back to step 386. Otherwise, control continues with step 340 as described above.

Figure 11:
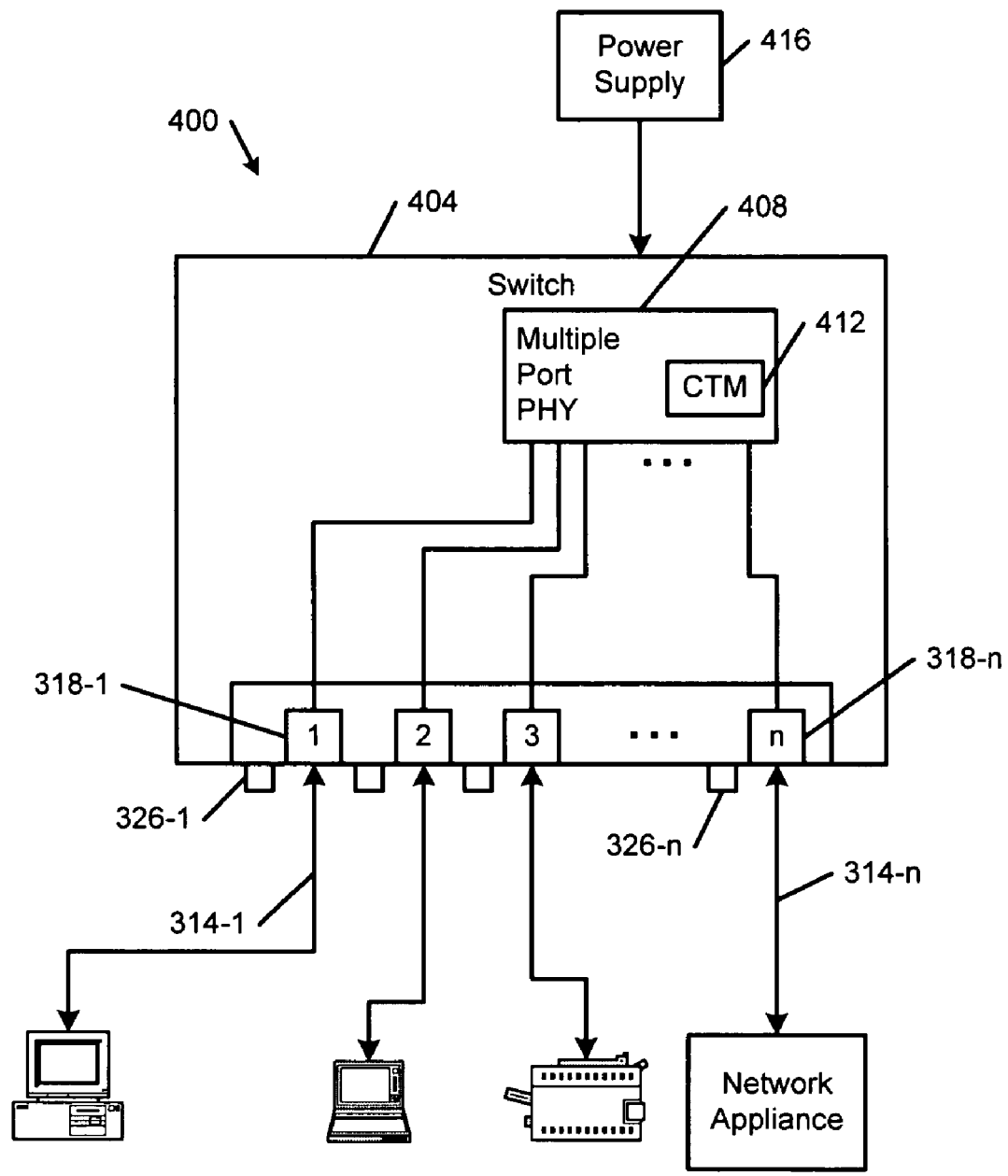

Referring now to FIG. 11, a network device 400 includes a physical layer device 408 and a cable tester 412, as described above. For example, the network device 400 can be a switch 404 that includes an n port physical layer device 408 and a cable test module (CTM) 412. However, any other network device that contains a physical layer device can be used. Cables 314-1, 314-2, . . . , and 314-n can be connected to the switch 404 using connectors 318-1, 318-2, . . . , and 318-n, such as RJ-45 connectors or any other suitable connector type. The switch 404 can be connected to other network devices such as, but not limited to, computers, laptops, printers, fax machines, telephones and any other network device or POE. In the embodiment shown in FIG. 11, the network device 400 initiates the cable test when powered on by a power supply 416. The cable test can be initiated manually and/or automatically on power up. The network device 400 also includes one or more LEDs 326-1, 326-2, . . . , and 326-n.

Figure 12:
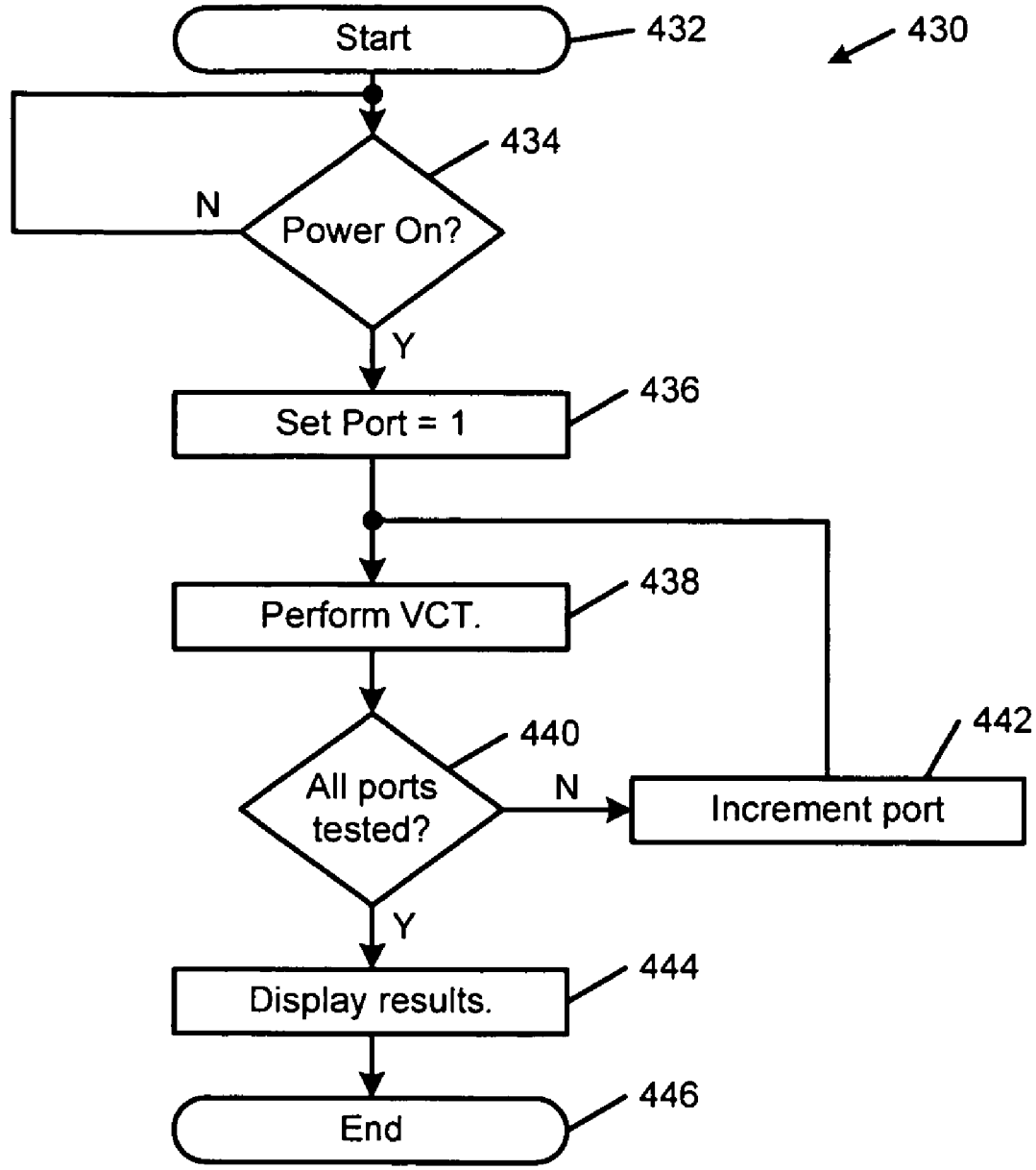
FIG. 12 is a flowchart illustrating steps for performing a cable test for the exemplary network device in FIG. 11.

Referring now to FIG. 12, steps for operating the network device 400 are shown generally at 430. Control begins with step 432. In step 434, control determines whether power is on. When power is on, control sets a port equal to 1 in step 436. In step 438, control performs the cable test as described above. In step 440, control determines whether all of the ports have been tested. If not, control increments the port and returns to step 438. If the network device has only one port, the steps 436, 440 and 442 may be skipped. Otherwise, control displays the results in step 444 and control ends in step 446. As can be appreciated by skilled artisans, the cable test can be executed sequentially for each port as set forth above or simultaneously for all ports.

Figure 13:
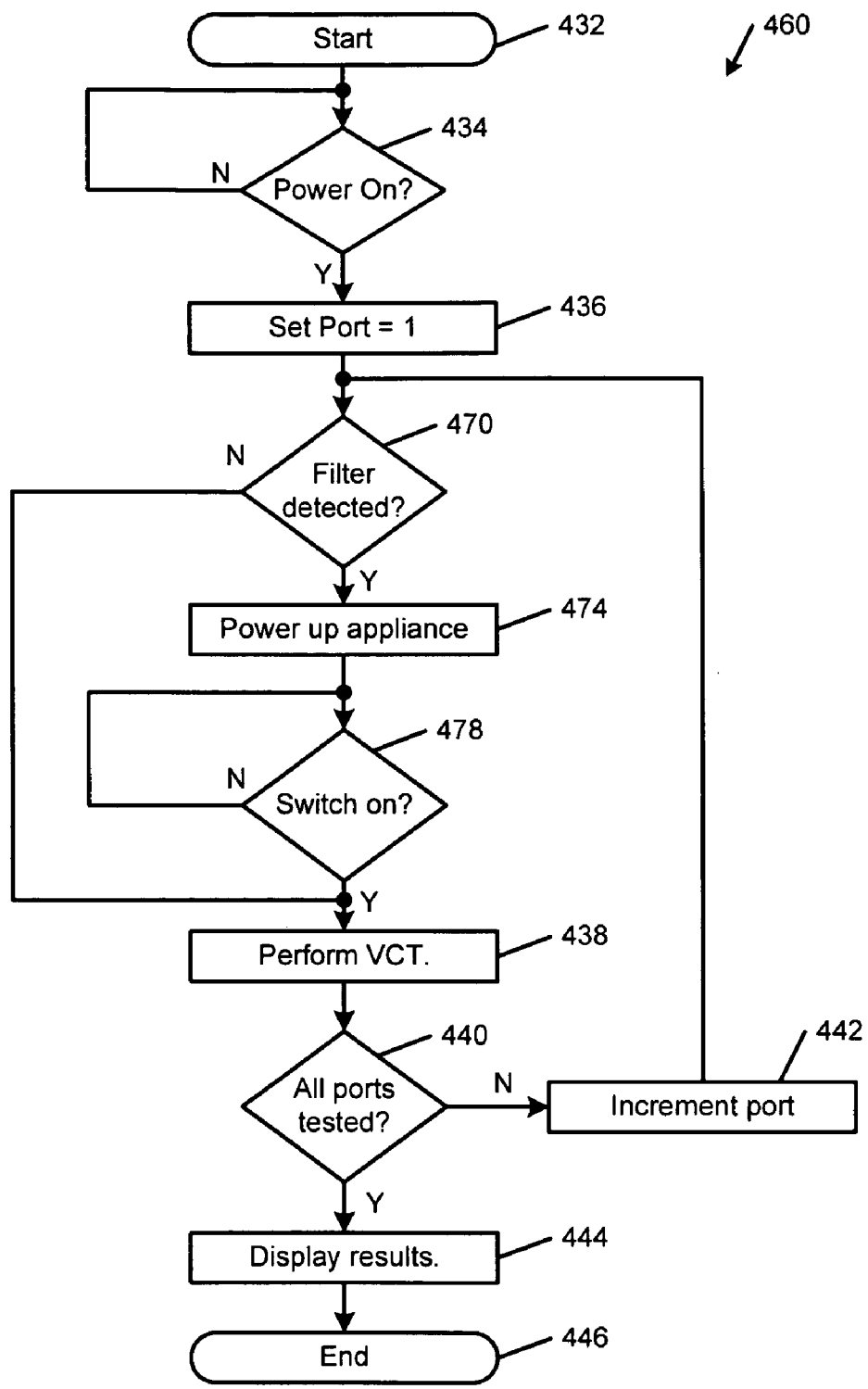
FIG. 13 is a flowchart illustrating steps for performing a cable test for the exemplary network device in FIG. 11 when POE devices are possibly connected at remote cable ends.
Figure 14A:
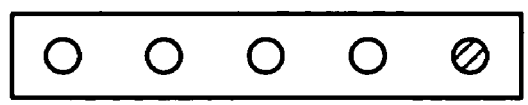
FIGS. 14A–14E illustrate exemplary LEDs during testing cable testing.
Figure 14B:
Figure 14C:
Figure 14D:
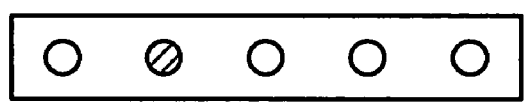
Figure 14E:
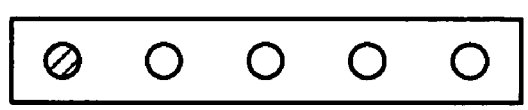

Referring now to FIG. 13, additional steps are performed when the network device may be connected to power over Ethernet (POE) devices as shown generally at 460. Common steps from FIG. 12 have been designated using the same reference number. In step 470, control determines whether the filter 466 is detected. If false, control continues with step 438 as described above. If a filter is detected, control powers up the POE device in step 474. In step 478, control determines whether the switch is on. If not, control loops back to step 478. Otherwise, control continues with step 438 as described above.

Referring now to FIGS. 14A–14E, control successively tests each port. Each port may be associated with one or more LEDs. During normal operation, the LEDs are used to indicate the presence or absence of a link, link activity, link speed or any other information. These same LEDs are also used to indicate testing in progress and the results of the cable test. As can be appreciated, other than the addition of the cable test module, no other hardware needs to be added.

Figure 15:
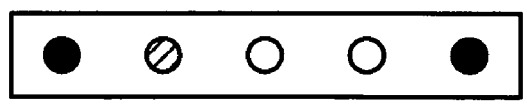
FIG. 15 illustrates the exemplary LEDs showing the results of cable testing.
Figure 16:
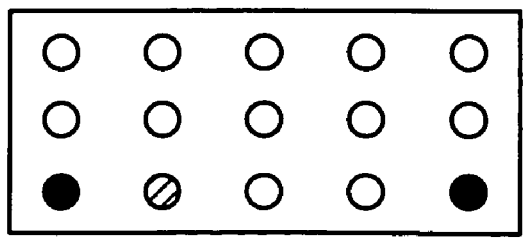
FIG. 16 illustrates exemplary LEDs of a network device that includes more than one LED per port.

When testing, the CTM may optionally turn on, turn off, or blink one or more of the LEDs to designate that a cable test is occurring on the associated port. Each of the ports are tested one or more times sequentially, randomly or in any order. When the tests are complete, the network device indicates the results using the LEDs, for example as shown in FIG. 15. For example, turning on the LED associated with a port indicates that a good cable communicates with the port. Turning the LED off indicates an open circuit. Blinking the LED indicates a short. As can be appreciated, the on, off and blinking states or speed and LED color can be assigned in a different manner to cable states of good, open, and short. The LEDs can be monochrome or color. Color LEDs can be used to indicate additional information such as the relative location of the failure (such as near, intermediate, far or other distance ranges), the identification of the signal pair with the fault, whether the fault relates to impedance mismatch, and/or the magnitude of the measured impedance (such as low, medium, high, open). By using existing, fully burdened LEDs to indicate the results of the cable test, the present invention provides lower cost network devices with built-in cable testing. While only one LED per port is shown in FIGS. 14 and 15, the network device may also include additional LEDs that are associated with each port as shown in FIG. 16.

Figure 17:
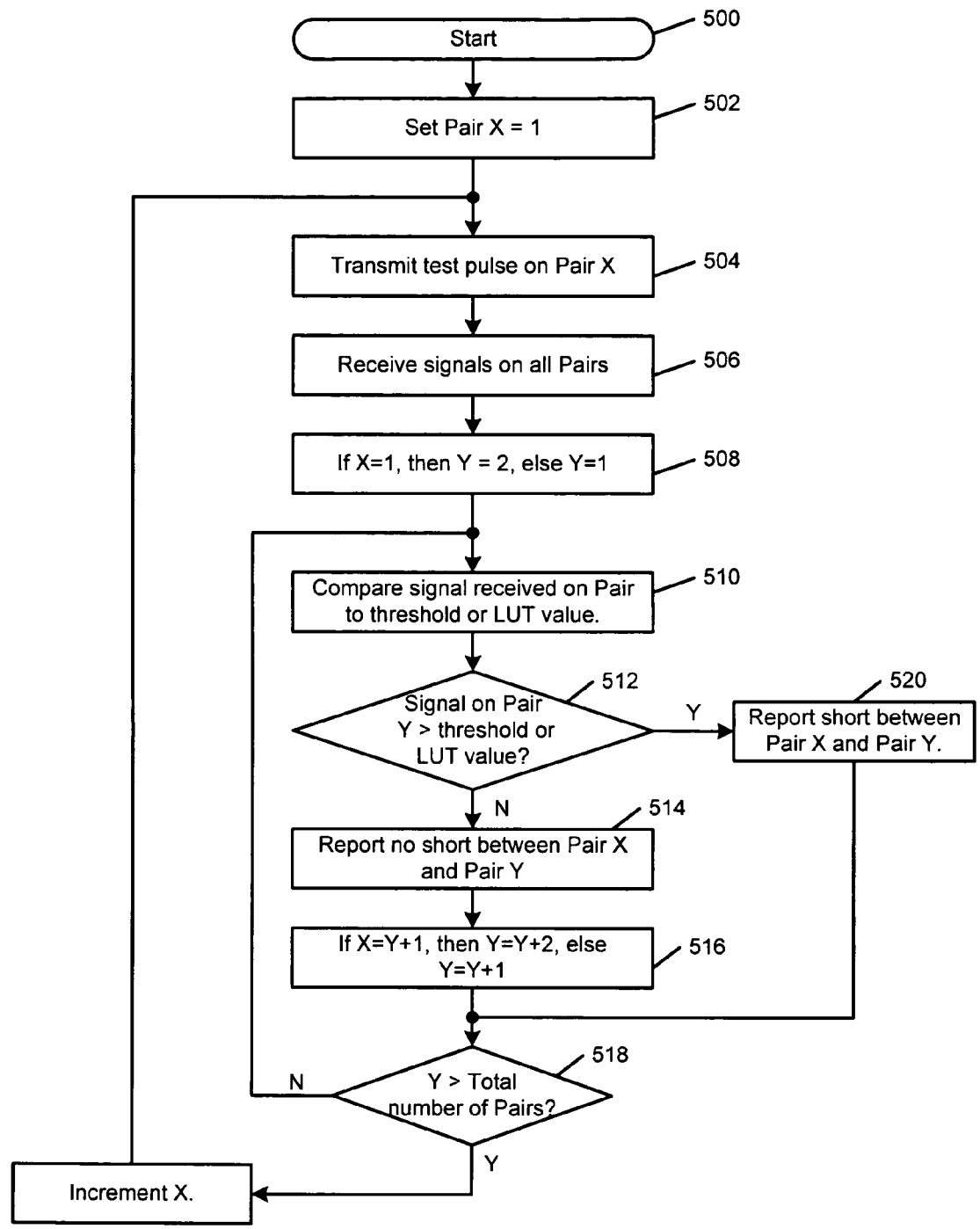
FIG. 17 illustrates steps performed by a cable test module to test for shorts between pairs of the same cable.

Referring now to FIG. 8 and FIG. 17, the cable test module 312 may be operated in an alternate mode. The cable test module 312 transmits a test pulse on a test pair and checks for reflected signals on all of the pairs. As can be appreciated, if a return signal above a predetermined fixed and/or variable threshold is received on pairs other than the test pair, the cable test module 312 signals a short circuit between the test pair and the pair with the return signal above the predetermined threshold. The predetermined threshold is set above expected crosstalk levels.

Referring now to FIG. 17, control begins with step 500. In step 502, control sets Pair X=1. In step 504, control transmits a test pulse on Pair X. In step 506, signals are received on all pairs. In step 508, if X=1, then Y=2 otherwise Y=1. The signal received on Pair Y is compared to the threshold in step 510. In step 512, control determines whether the received signal is greater than the threshold value. If not, control continues with step 514 and reports a "no short" status between Pair X and Pair Y. In step 516, if X=Y+1, then Y=Y+2, else Y=Y+1. In step 518, control determines whether Y is greater than the total number of pairs. If not, control continues with step 510. If step 512 is true, control continues with step 520 and reports a short status between Pair X and Pair Y and declares a failed cable test for the port. If step 518 is true, X is incremented and control continues with step 504. If the network device has additional ports, such as in a switch, the other ports are tested in a similar manner.

If the cable fails the test, the CTM sends a signal to the PHY 308, which shuts down the port that is associated with the failed pair(s). After a predetermined off period, the CTM powers up the port and performs the cable test on the pairs. As can be appreciated, powering down the failed port reduces power consumption. Alternatively, the CTM can automatically downshift to a lower speed using fewer pairs, as will be described below.

Figure 18:
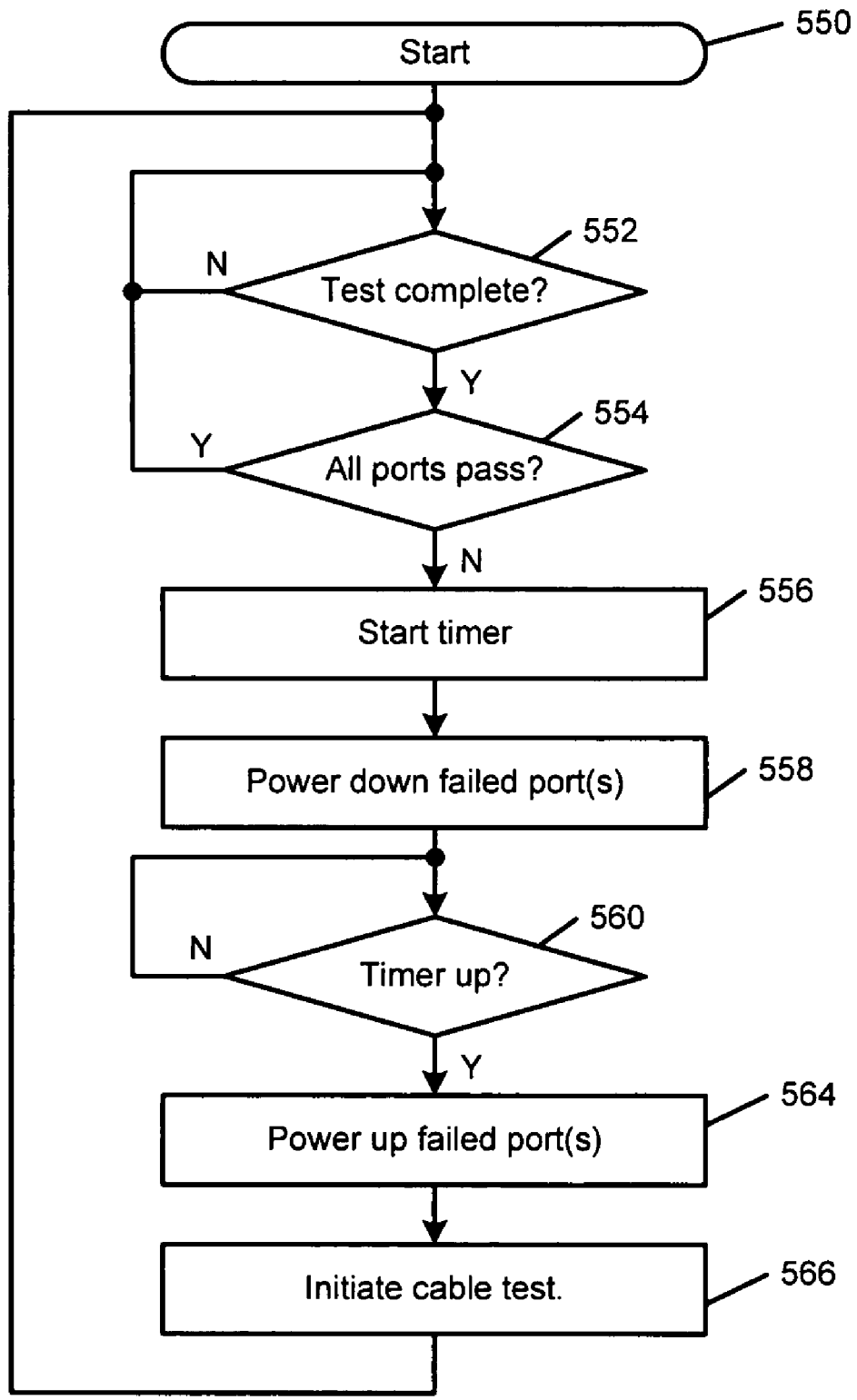
FIG. 18 illustrates cable powerdown and powerup steps that are performed when a short is detected in FIG. 17.

Referring now to FIG. 18, the powerdown steps according to the present invention are shown in further detail. Control begins in step 550. In step 552, control determines whether the cable test (FIG. 17) is complete. If not, control loops back to step 552. Otherwise control continues with step 554 where control determines whether all ports passed the test. If true, control continues with step 552. Otherwise, control starts a timer in step 556. In step 558, control powers down the failed port(s). In step 560, control determines whether the timer is up. If not, control loops back to step 560. Otherwise, control continues with step 564 and powers up the failed ports. In step 566, control initiates the cable test (FIG. 17 and/or other tests described herein) in step 566.

Figure 19:
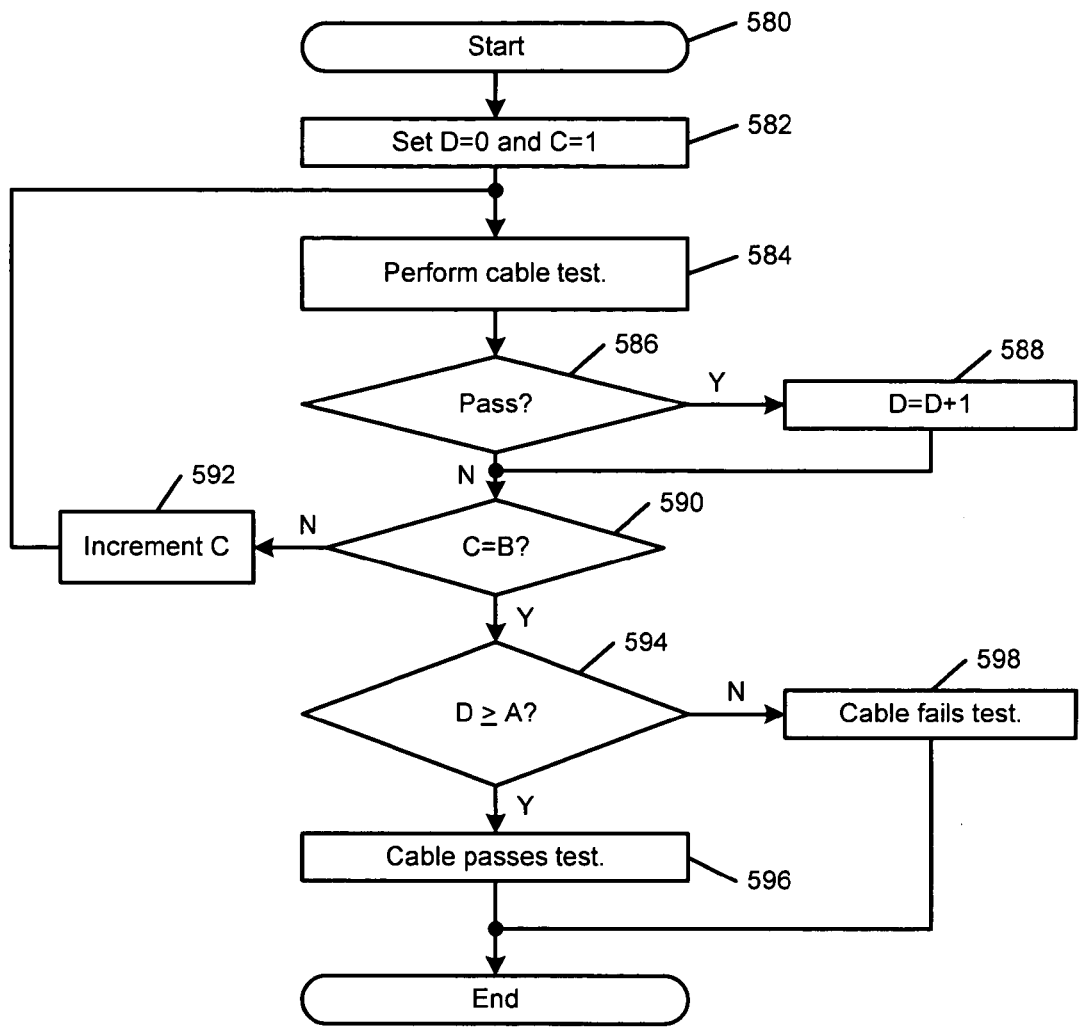
FIG. 19 illustrates steps of a cable test method employing A out of B pass/fail criteria.

Referring now to FIG. 19, the CTM operates the cable test B times on each pair where B is greater than or equal to two. The CTM requires A out of B cable tests to pass (and/or fail) before the CTM declares a test pass (and/or fail). In addition to and/or instead of A out of B criteria, the CTM may also perform mathematical, Boolean or other calculations on the results to increase the accuracy of the results. As a non-limiting example, the distance, reflected amplitude, reflected timing and/or attenuation results of the multiple tests may be averaged before using the lookup tables. Alternately, the highest and/or lowest results can be disregarded and the calculation can be made on the remaining results.

In FIG. 19, steps for implementing the A out of B test criteria according to the present invention are shown. Control begins with step 580. In step 582, control sets D=0 and C=1. In step 584, control performs the cable test. In step 586, control determines whether the cable passes the cable test. If true, control continues with step 588 and sets D=D+1. Control continues from step 588 to step 590 and determines whether C=B. If not, control increments C in step 592 and continues with step 592. If step 590 is true, control continues with step 594 and determines whether D≧A. If true, the cable passes the test in step 596. If false, the cable fails the test in step 598. As can be appreciated, similar procedures can be used to determine A out of B failures of a condition.

Figure 20:
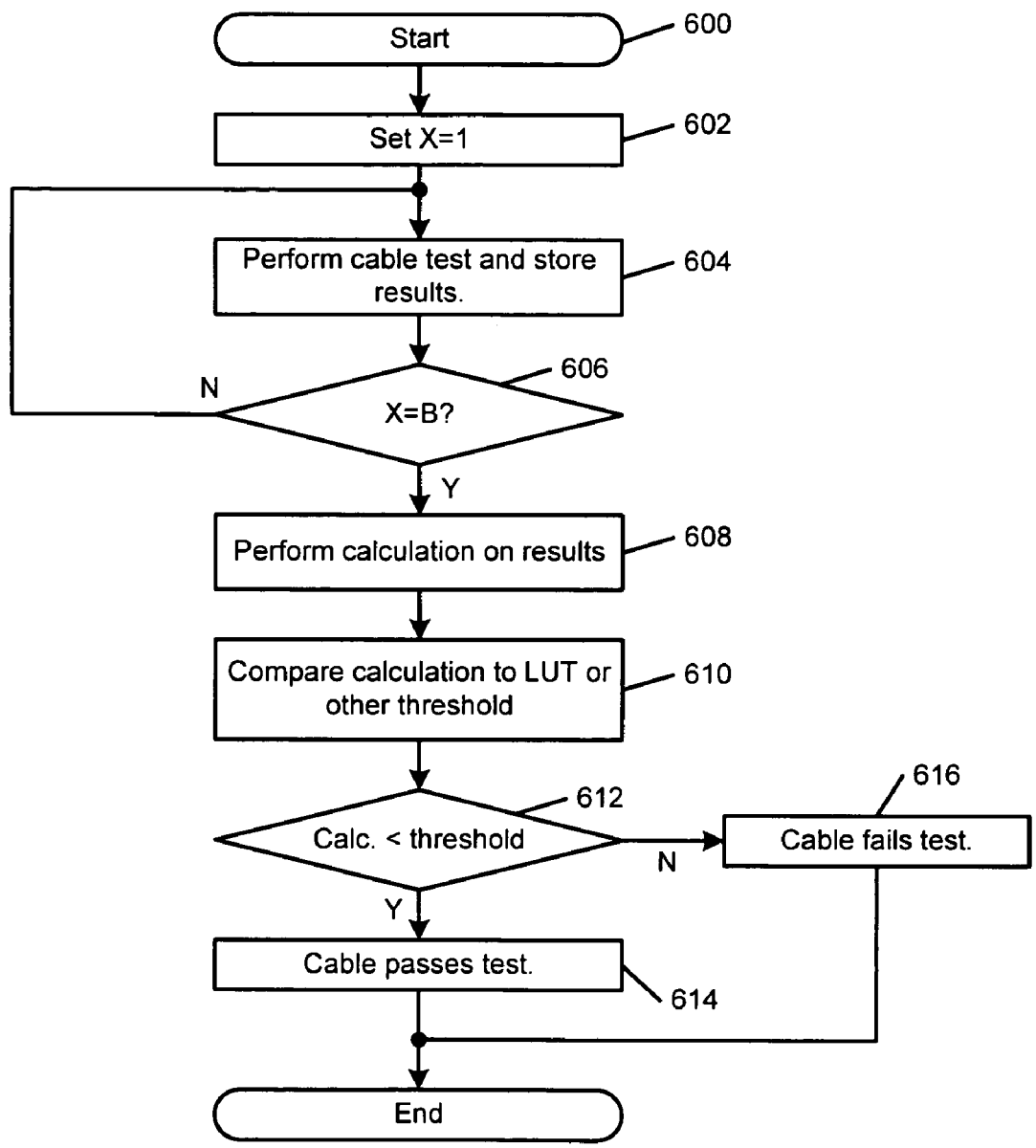
FIG. 20 illustrates steps of a cable test method that performs calculations on the results of repeated cable tests on the same cable.

Referring now to FIG. 20, the cable test module performs calculations on multiple tests. The cable test module compares the calculation to thresholds to determine the pass/fail status. Control begins in step 600. In step 602, control sets X=1. In step 604, the cable test is performed and the results are stored. In step 606, control determines whether X=B. If not, control returns to step 604. Otherwise, control continues with step 608 and performs a calculation on the stored results. In step 610, the calculation is compared to a lookup table (LUT) or a stored threshold. In step 612, control determines whether the calculated value is less than the lookup table value or the stored threshold. If true, control continues with step 614 and declares that the cable test is passed. If step 612 is false, control declares that the cable test is failed. As can be appreciated, the test in step 612 can use other functional operations such as greater than, less than or equal to, greater than or equal to, equal and/or any other suitable mathematical or Boolean operator. For example, the calculation in step 612 can be average attenuation.

The cable testing is typically performed before establishing a link. The results of the cable test are used according to the present invention to decrease the time required to establish a link. More particularly, a timer that is used to break the link prior to starting the cable test can be toggled on or off. By allowing the timer to turn on or off, the amount of time that is required for a test can be reduced when it is known that there is no active link partner.

Figure 21:
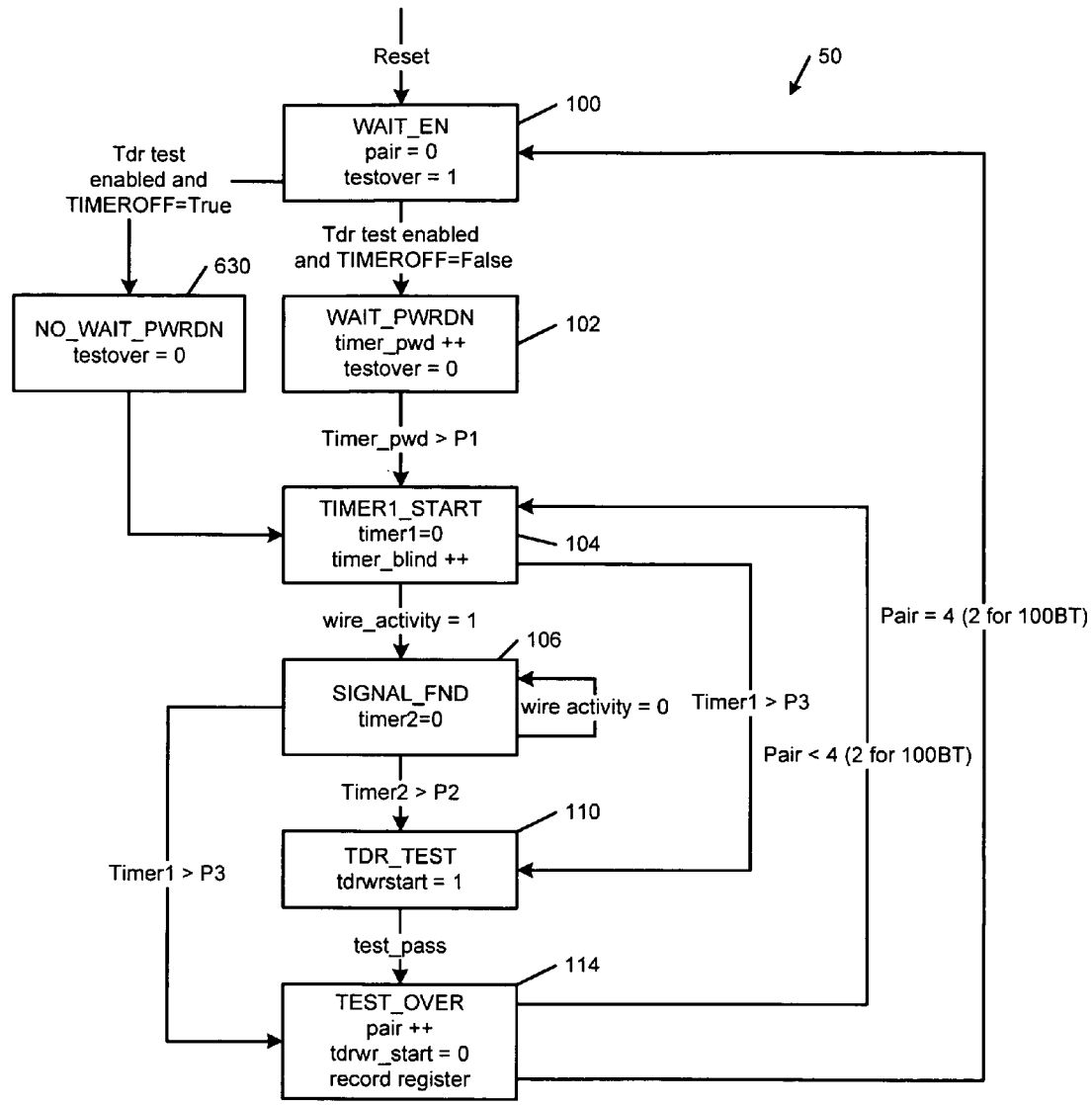
FIG. 21 illustrates a state machine with timer that can be disabled when link partners are not present.

For example, a link partner is not present when the cable is connected at one end only. Referring now to FIG. 21, an additional state is added according to the present invention to the state machine that is set forth in FIG. 3. If the TDR test is enabled and TIMEROFF=TRUE, the state machine transitions from the WAIT_EN state 102 to a NO_WAIT_PWRDN state 630. The CTM sets the TIMEROFF=TRUE when a pair fails the cable test. In the NO_WAIT_PWRDN state 630, testover is set equal to 0 and the state machine transitions to the TIMER1_START state 104. If the TDR test is enabled and TIMEROFF=FALSE, (when the cable passes the cable test) the state machine transitions from the WAIT_EN state 102 to the WAIT_PWRDN state 102, as previously described above.

Figure 22:
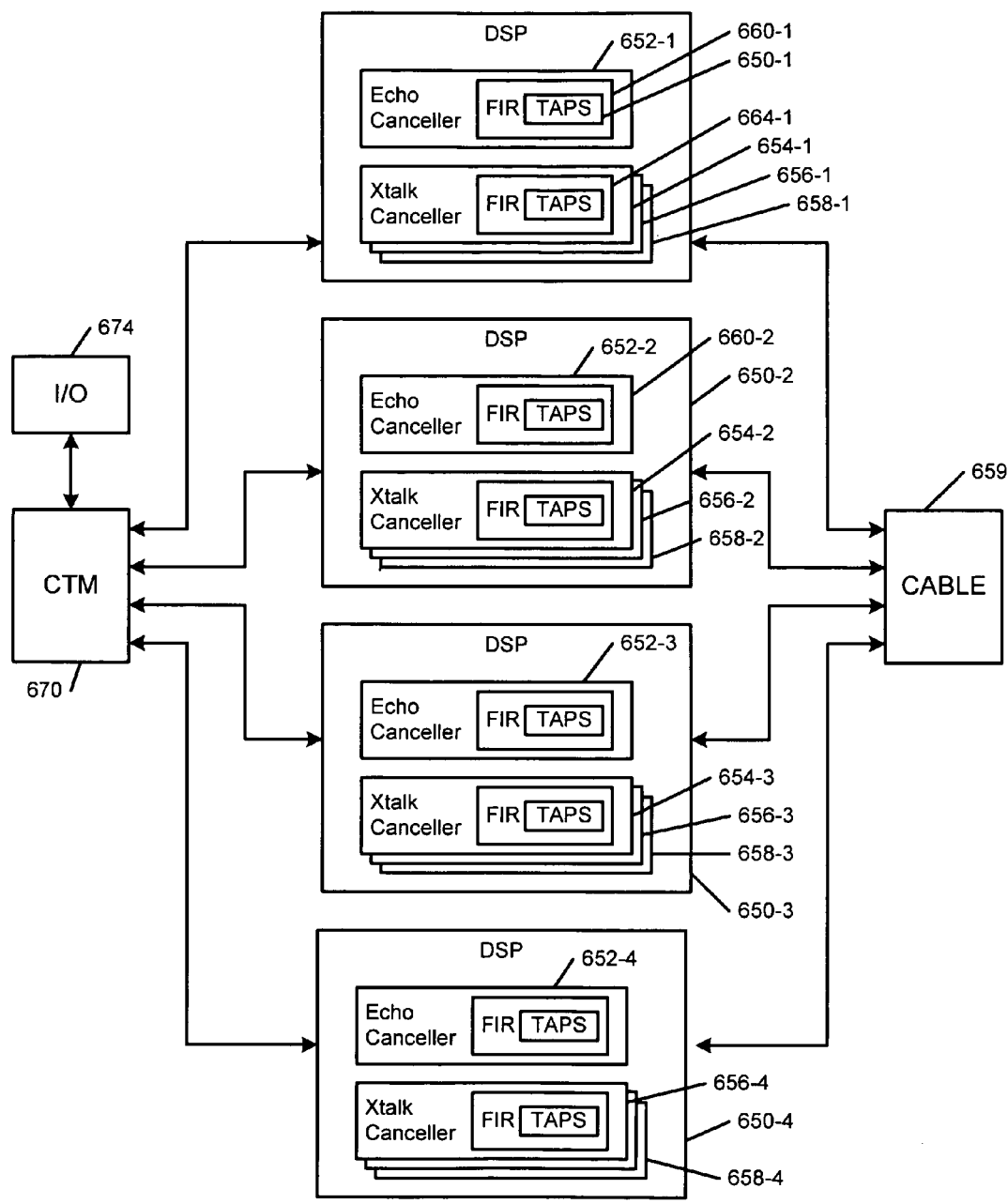
FIG. 22 is a functional block diagram of an echo and crosstalk distance estimator.
Figure 23:
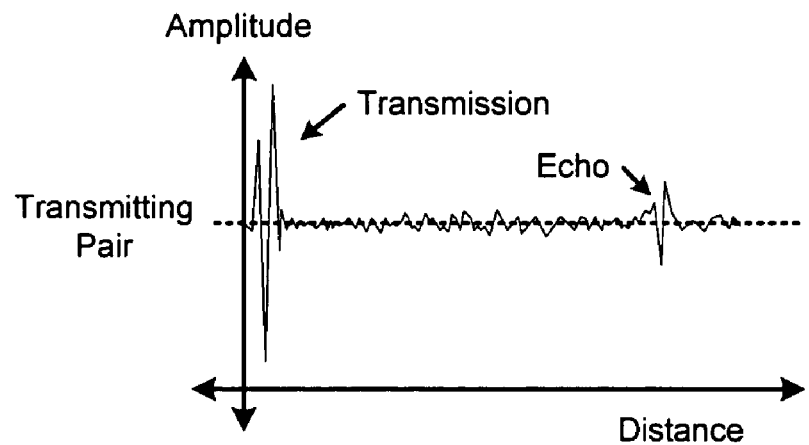
FIG. 23 is a waveform of an exemplary transmitted signal on a pair with echo signal components.
Figure 24:
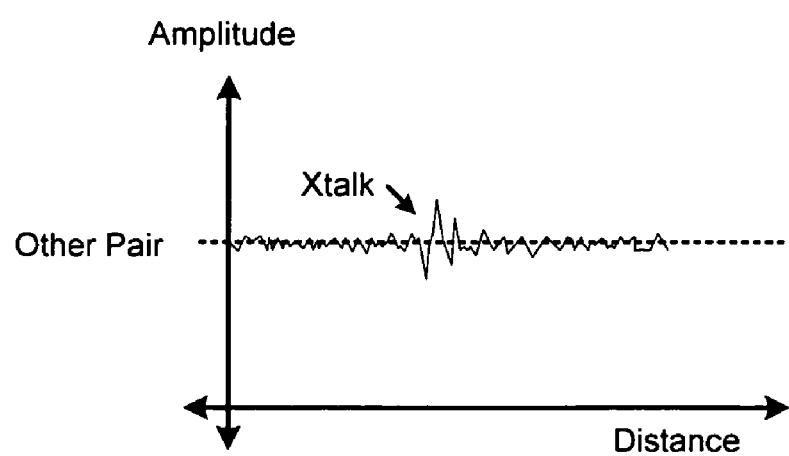
FIG. 24 is a waveform of an exemplary signal on another pair with crosstalk signal components.

Referring now to FIGS. 22, 23 and 24, the cable tester transmits a waveform on one pair. An echo canceller circuit of a digital signal processor (DSP) that is associated with the pair performs echo cancellation. Crosstalk circuits that are associated with the other pairs of the cable perform crosstalk cancellation. The cable test module reads taps of finite impulse response (FIR) filters in the echo and crosstalk cancellers. The locations of the echo and crosstalk are identified according to the present invention and displayed. A link does not need to be established.

More particularly in FIG. 22, a physical layer device includes a first DSP 650-1 with an echo canceller circuit 652-1 and crosstalk circuits 654-1, 656-1 and 658-1. The DSP 650-1 is associated with a first pair of a cable 659. Suitable DSP designs can be found in "Movable Tap Finite Impulse Response Filter", U.S. patent Ser. No. 09/678,728, filed Oct. 4, 2000 and "Finite Impulse Response Filter" U.S. patent Ser. No. 60/217,418, filed Jul. 11, 2000, which are both hereby incorporated by reference in their entirety. The crosstalk circuits 654-1, 656-1 and 658-1 measure and cancel crosstalk on the first pair that is due to the second pair (1:2), crosstalk on the first pair that is due to the third pair (1:3), and crosstalk on the first pair that is due to the fourth pair (1:4), respectively. The echo canceller circuit 652-1 includes a finite impulse response (FIR) filter 660-1 having taps 662-1. The crosstalk circuits 654-1, 656-1 and 658-1 also include FIR filters 664-1 with taps 666-1.

A second DSP 650-2 includes an echo canceller circuit 652-2 and crosstalk circuits 654-2, 656-2 and 658-2. The DSP 650-2 is associated with a second pair of the cable 659. The crosstalk circuits 654-2, 656-2, 658-2 measure and cancel crosstalk on the second pair that is due to the first pair (2:1), crosstalk on the second pair that is due to the third pair (2:3), and crosstalk on the second pair that is due to the fourth pair (2:4), respectively. The echo canceller and crosstalk circuits 652-2, 654-2, 656-2 and 658-2 likewise include finite impulse response (FIR) filters and taps.

A third DSP 650-3 includes an echo canceller circuit 652-3 and crosstalk circuits 654-3, 656-3 and 658-3. The DSP 650-3 is associated with a third pair of the cable 659. The crosstalk circuits 654-3, 656-3, and 658-3 measure and cancel crosstalk on the third pair that is due to the first pair (3:1), crosstalk on the third pair that is due to the second pair (3:2), and crosstalk on the third pair that is due to the fourth pair (3:4), respectively. The echo canceller and crosstalk circuits 652-3, 654-3, 656-3 and 658-3 likewise include finite impulse response (FIR) filters and taps.

A fourth DSP 650-4 includes an echo canceller circuit 652-4 and crosstalk circuits 654-4, 656-4 and 658-4. The DSP 650-4 is associated with a fourth pair of the cable 659. The crosstalk circuits 654-4, 656-4, and 658-4 measure and cancel crosstalk on the fourth pair that is due to the first pair (4:1), crosstalk on the fourth pair that is due to the second pair (4:2), and crosstalk on the fourth pair that is due to the third pair (4:3), respectively. The echo canceller and crosstalk circuits 652-4 and 654-4 likewise include finite impulse response (FIR) filters and taps.

Referring now to FIGS. 22, 23, and 24, the test waveform such as a 1000BASET waveform is transmitted on one pair of the cable 660 such as the first pair. A CTM 670 reads taps of FIR filters of the echo canceller 652-1 of the first pair and the taps of the FIR filters of the crosstalk canceller circuits 654-2, 654-3 and 654-4 (2:1, 3:1, and 4:1) that are associated with the other pairs. In other words, the CTM 670 identifies the echo and the crosstalk components by reading the taps of the FIR filters. The CTM 670 identifies a distance to echo and the crosstalk components and their respective amplitudes and stores the information in memory. The CTM 670 outputs the data via a display 674.

Figure 25:
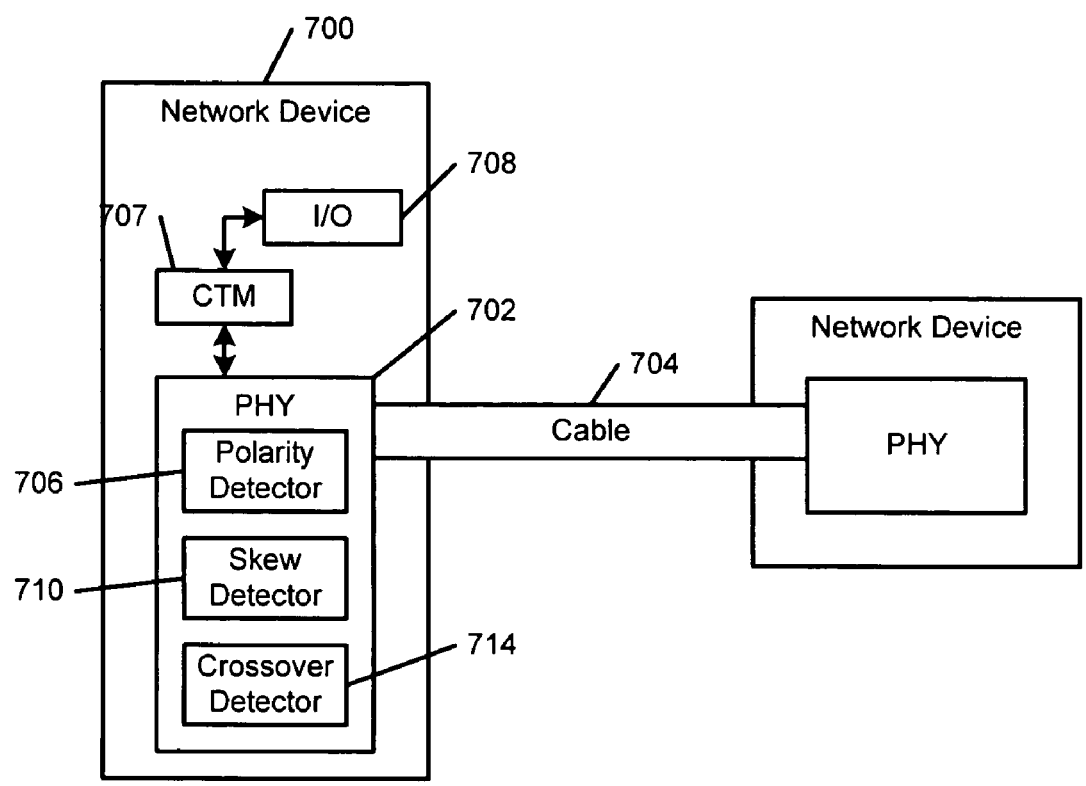
FIG. 25 is a functional block diagram of a cable test module that displays skew, polarity and crossover status data.

Referring now to FIG. 25, a network device 700 includes a physical layer device 702 that is connected to a cable medium 704. The cable medium includes multiple pairs of twisted pair wires. The physical layer device 702 includes a polarity detector circuit 706 that detects a polarity of each pair. The polarity detector circuit 706 determines whether link pulses of the pair are positive-going or negative-going. If the link pulse is negative-going, the polarity detector circuit 706 swaps the pairs. Swap status data is stored in memory that is associated with the physical layer device 702, the polarity detector circuit 706, or in any other suitable device. A cable test module 707 accesses the swap status data for output to a display 708.

The physical layer device 702 further includes a skew detector circuit 710. The skew detector circuit 710 determines whether one pair is longer than the other pair and then inserts digital delays to equalize the timing of the pairs. The skew detector circuit 710 stores the calibrated digital delay in memory that is associated with the physical layer device, the skew detector circuit 710, or any other suitable device. The cable test module 707 accesses and displays the skew data for each pair.

The physical layer device 702 further includes a cable crossing detector circuit 714. The cable crossing detector circuit 714 determines whether any of the pairs of wires are crossed. The cable crossing detector circuit 714 stores the cable crossing status in memory that is associated with the physical layer device, the cable crossing detector circuit 714, or any other suitable device. The cable test module 707 accesses and displays the cable crossing data for each pair.

Figure 26:
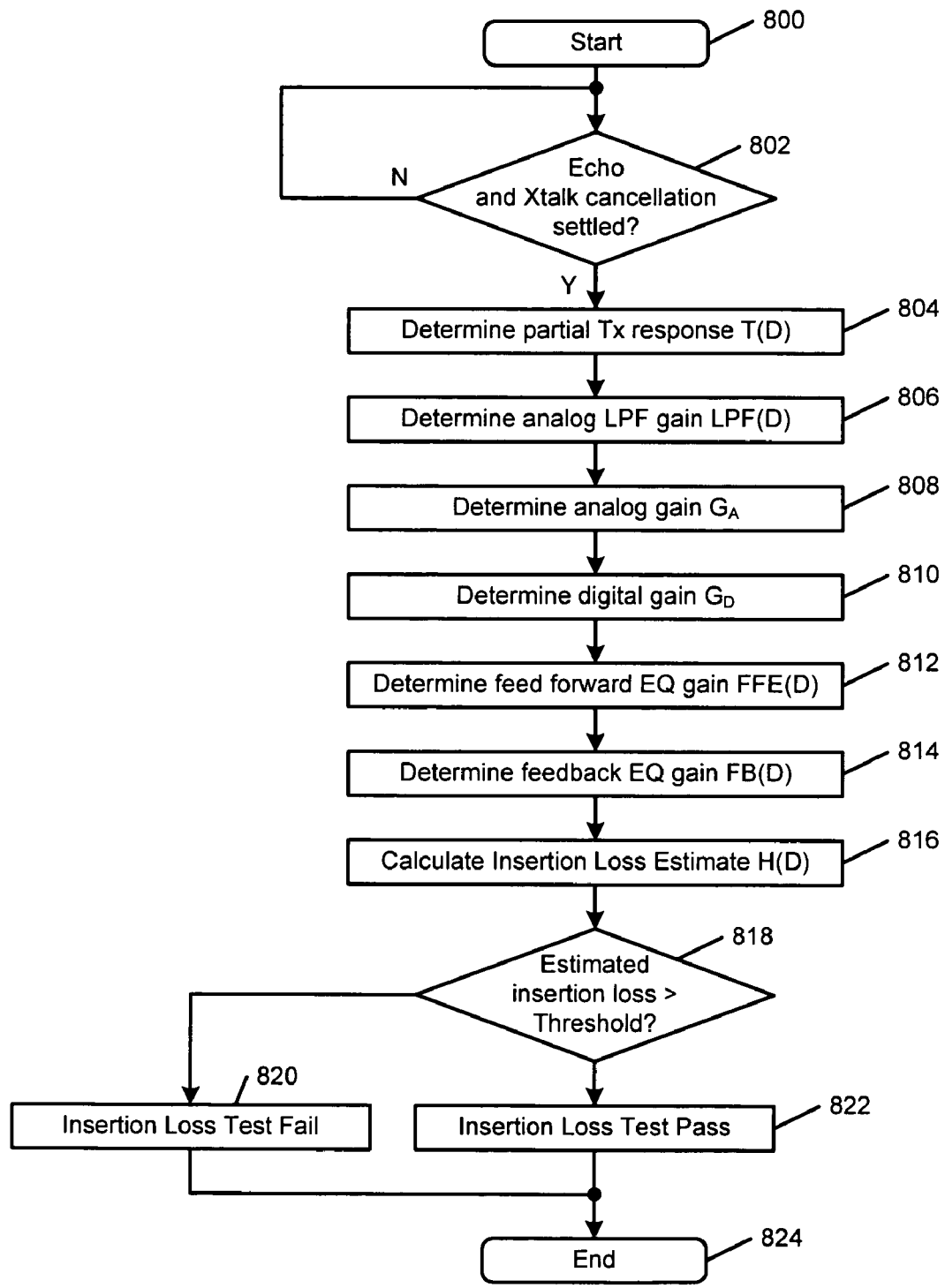
FIG. 26 illustrates steps performed by a cable test module to estimate an insertion loss.

Referring now to FIG. 26, the cable test module according to the present invention estimates insertion loss. Control begins with step 800. In step 802, control determines whether echo and crosstalk circuits of the DSP have settled. If not, control loops back to step 802. In step 804, control determines the partial response of the transmitter T(D) in the digital domain. In step 806, an analog low pass filter gain LPF(D) in the digital domain is determined. In step 808, an analog gain $G_A$ is determined. In step 810, a digital gain $G_D$ is determined. In step 812, a feed forward equalizer gain FFE(D) in the digital domain is determined. In step 814, a feedback equalizer FB(D) in the digital domain is determined. In step 816, insertion loss is estimated based on the following relationship:

$$H(D) = \frac{1 + FB(D)}{T(D)LPF(D)G_A G_D FF(D)}$$

In step 818, the estimated insertion loss H(D) is compared to a threshold. The threshold can be generated by a stored threshold, a lookup table, or a mathematical relationship. If the insertion loss H(D) is greater than the threshold, the pair fails the insertion loss test in step 820. Otherwise, the pair passes the insertion loss test in step 822. Control ends in step 824. The test is performed in series and/or parallel for the pairs. If one or more of the pairs of the cable fails the insertion loss test, the physical layer device can automatically downshift to lower speeds, as will be described below.

Figure 27:
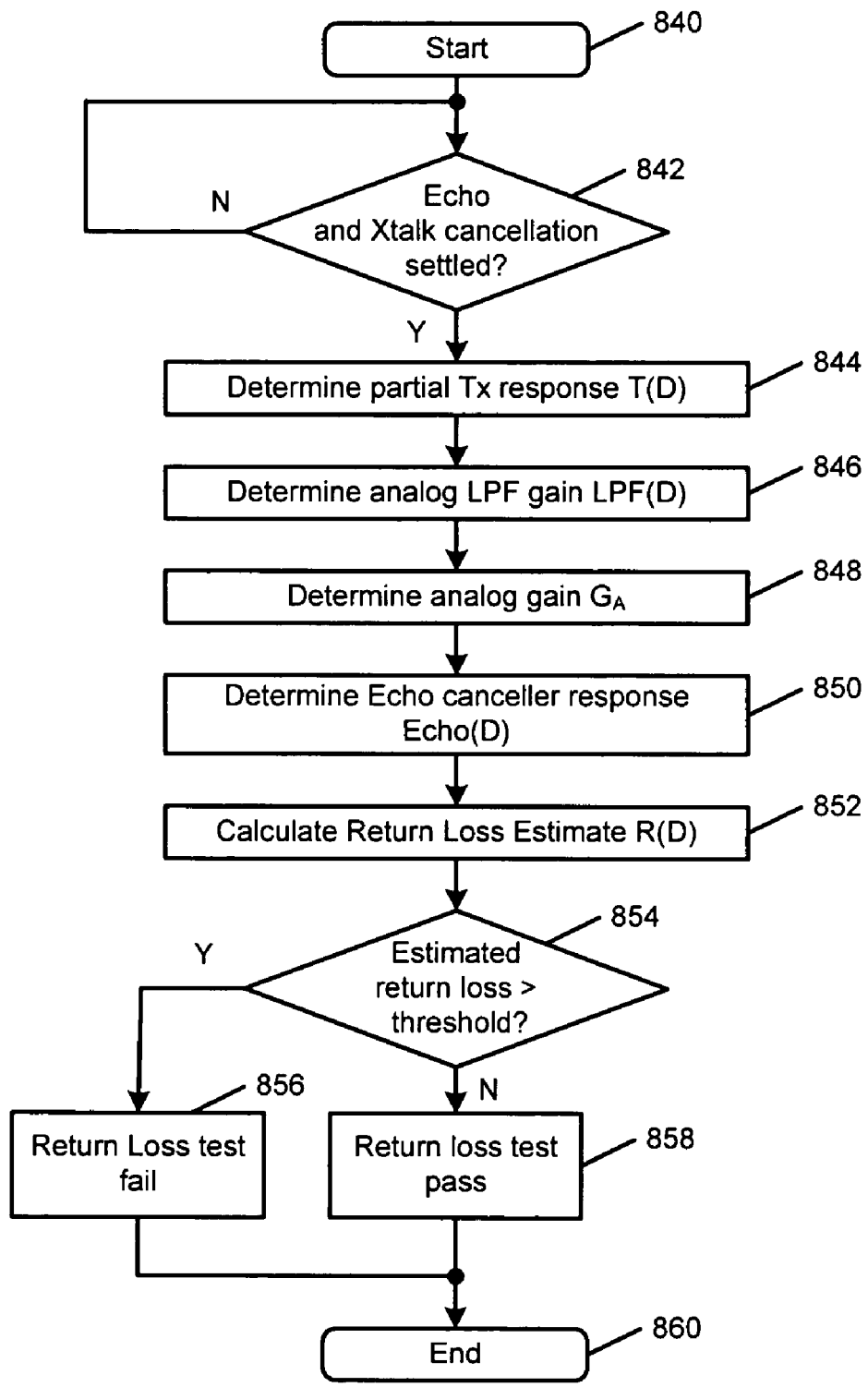
FIG. 27 illustrates steps performed by a cable test module to estimate a return loss.

Referring now to FIG. 27, the cable test module according to the present invention also estimates return loss R(D). Control begins with step 840. In step 842, control determines whether echo and crosstalk circuits of the DSP have settled. If not, control loops back to step 842. In step 844, control determines the partial response of the transmitter T(D) in the digital domain. In step 846, an analog LPF gain LPF(D) in the digital domain is determined. In step 848, an analog gain $G_A$ is determined. In step 850, control determines the response of the echo canceller Echo(D) in the digital domain. In step 852, the return loss is estimated based on the following equation:

$$R(D) = \frac{Echo(D)}{T(D)LPF(D)G_A}$$

In step 854, the estimated return loss R(D) is compared to a threshold. The threshold can be generated by a stored threshold, a lookup table or a mathematical relationship. If the return loss is greater than the threshold, the pair fails the insertion loss test in step 856. Otherwise, the pair passes the insertion loss test in step 858. Control ends in step 860. The test is performed in series and/or in parallel for the pairs. If one or more of the pairs of the cable fails the return loss test, the physical layer device can automatically downshift to lower speeds, as will be described.

Figure 28A:
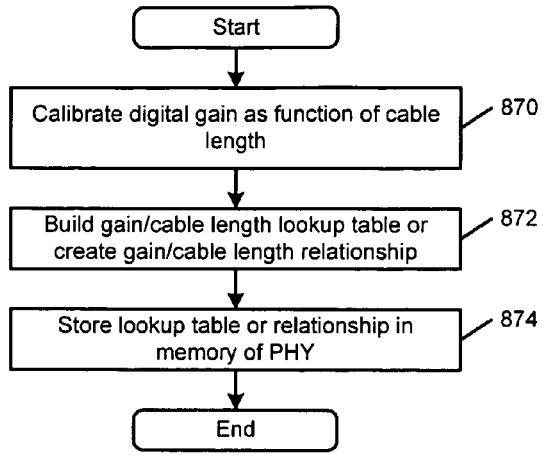
FIG. 28A illustrates steps for calibrating cable length as a function of digital gain.
Figure 29:
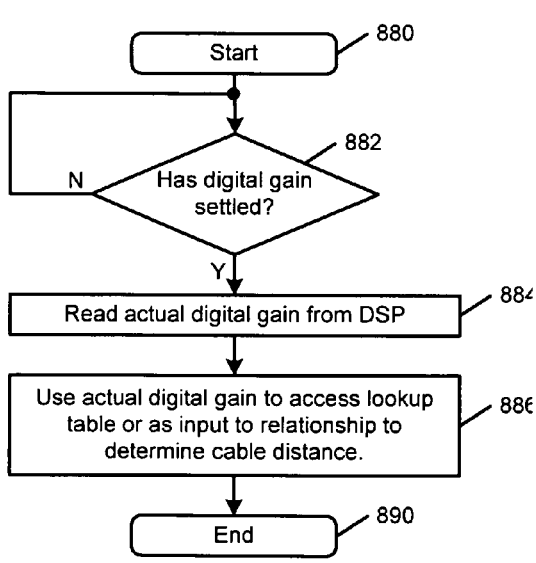
FIG. 29 illustrates steps performed by a cable length estimator.
Figure 28B:
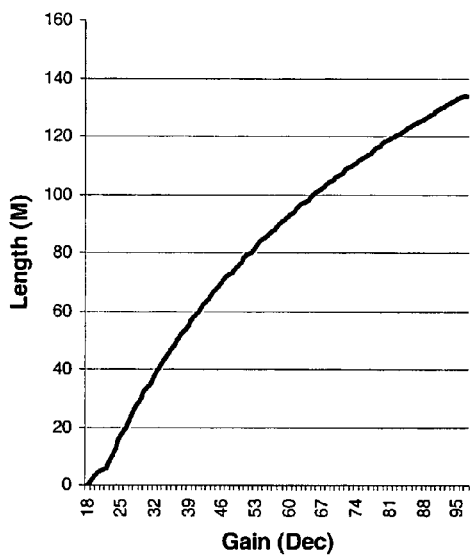
FIG. 28B is a waveform illustrating cable length as a function of digital gain.

Referring now to FIGS. 28A, 28B and 29, the cable test module according to the present invention uses the digital gain of the DSP after settling to estimate cable length. In FIG. 28A, digital gain is calibrated as a function of cable length for a particular type of cable in step 870. For example, CAT 5 cable is calibrated. In step 872, a digital gain/cable length lookup table or mathematical relationship is created based on the calibration. In step 874, the mathematical relationship or lookup table is stored in memory of the physical layer device, the network device and/or the cable tester. A typical lookup table is shown in FIG. 28B. An approximately exponential relationship is shown. To reduce the cost of estimating the cable length, the lookup table can be simplified by a mathematical relationship that approximates the actual relationship with some loss in accuracy.

In FIG. 29, the lookup table and/or mathematical relationship is used to estimate cable length after the digital gain of the DSP settles. Control begins in step 880. In step 882, control determines whether the digital gain of the DSP has settled. If not, control loops back to step 882. Otherwise, control continues with step 884 and reads the digital gain from the DSP. In step 886, the digital gain is used to estimate the cable length using the lookup table or the mathematical relationship.

Referring now to FIGS. 30A, 30B and 31, the cable tester according to the present invention uses the reflection amplitude to estimate the impedance of the cable. In FIG. 30A, the impedance is calibrated as a function of reflection amplitude for a particular type of cable in step 900. For example, the cable can be CAT 5. In step 902, a reflection amplitude/impedance lookup table or mathematical relationship is created based on the calibration. In step 904, the lookup table or relationship is stored in memory of the physical layer device, the network device, and/or the cable tester. A typical lookup table is shown in FIG. 30B. To reduce the cost of implementing the cable tester with the impedance estimator, the lookup table can be simplified by a mathematical relationship that estimates the actual values.

Referring now to FIG. 31, the cable tester inputs the reflection amplitude to the lookup table and/or mathematical relationship, which output an estimated cable impedance. Control begins in step 910. In step 912, control determines whether the reflection amplitude is measured. If not, control loops back to step 912. Otherwise, control continues with step 914 and reads the reflection amplitude from the DSP. In step 916, the reflection amplitude is used to estimate the impedance using the lookup table or the mathematical relationship. Control ends in step 920. As with the insertion loss and return loss described above, the impedance can be compared to a threshold. Pass/fail decisions and/or downshift decisions can be made based on the estimated impedance.

Figure 32A:
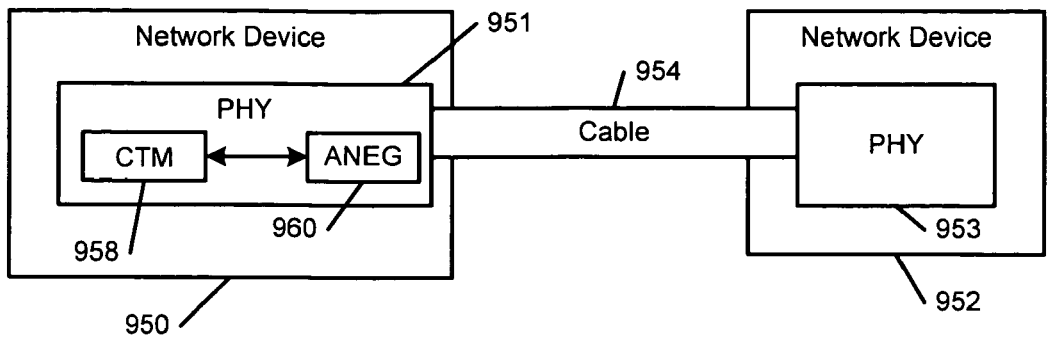
FIG. 32A is a functional block diagram of a cable test module that triggers an autonegotiation downshift based on a detected open or short pair during the cable test.
Figure 32B:
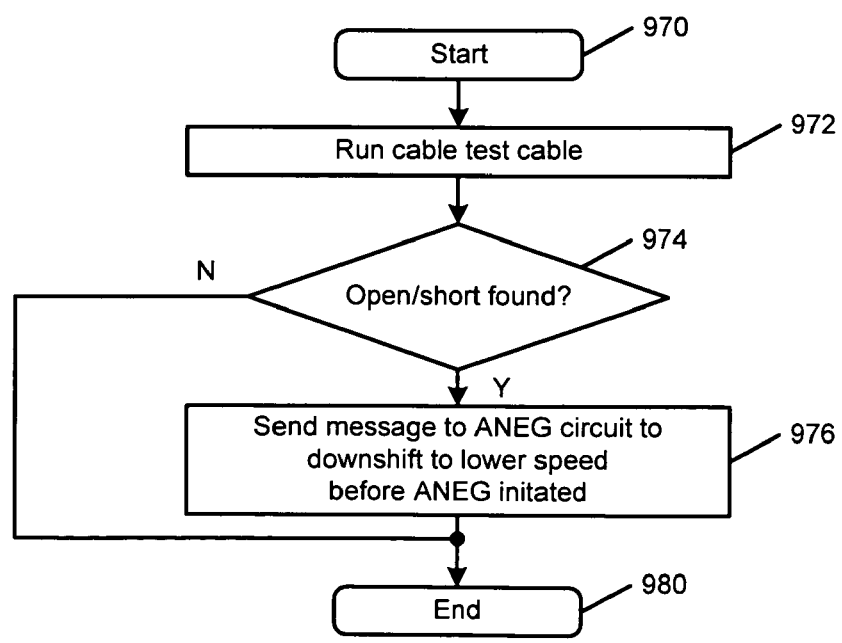
FIG. 32B illustrates steps performed by the cable test module in FIG. 32A.

Referring now to FIGS. 32A and 32B, the cable test module and an autonegotiation circuit according to the present invention automatically downshift from a higher speed to a lower speed when faulty pairs are found. In "Apparatus And Method For Automatic Speed Downshift For A Two Pair Cable", U.S. patent application Ser. No. 09/991,043, Filed Nov. 21, 2001, which is hereby incorporated by reference in its entirety, automatic speed downshift from 1000 Mbps to 10/100 Mbps is performed if autonegotiation is not successful at 1000 Mbps. For example, if the cable test module determines that one or two of the four pairs have an open or short status, the cable test module and autonegotiation circuit downshift and the link is brought up at 10/100 Mbps speeds on the two operable pairs. As can be appreciated, attempting to establish the link at 1000 Mbps takes time. The cable test is run prior to autonegotiation. Therefore if the cable test identifies a faulty pair, the cable tester sends a message to the autonegotiation circuit to downshift before attempting autonegotiation at 1000 Mbps, which reduces the amount of time required to establish the link (at the lower speed). While 1000 Mpbs and 10/100 Mbps link rates are described, skilled artisans can appreciate that the present invention applies to other link speeds and other numbers of pairs.

In FIG. 32A, a first network device 950 includes a physical layer 952 and a second network device 952 includes a physical layer 953. A cable 954 includes four pairs of twisted pair wires. The physical layer 952 includes a cable test module 958 and an autonegotiation circuit 960. In FIG. 32B, control begins in step 970. In step 972, the cable test is run by the cable test module 958 as described herein. In step 974, control determines whether the cable test module found an open or short cable status. If an open or short cable status is found, the cable test module sends a message to the autonegotiation circuit to downshift in step 976 and control ends in step 980. As was described above, other criteria may be used to trigger a downshift such as impendence, return loss, insertion loss and/or other calculated parameters. If step 974 is false, control ends in step 980. Since the decision to downshift has already been made, the autonegotiation circuit brings the link up at the lower speed more quickly.

Figures 33, 34:
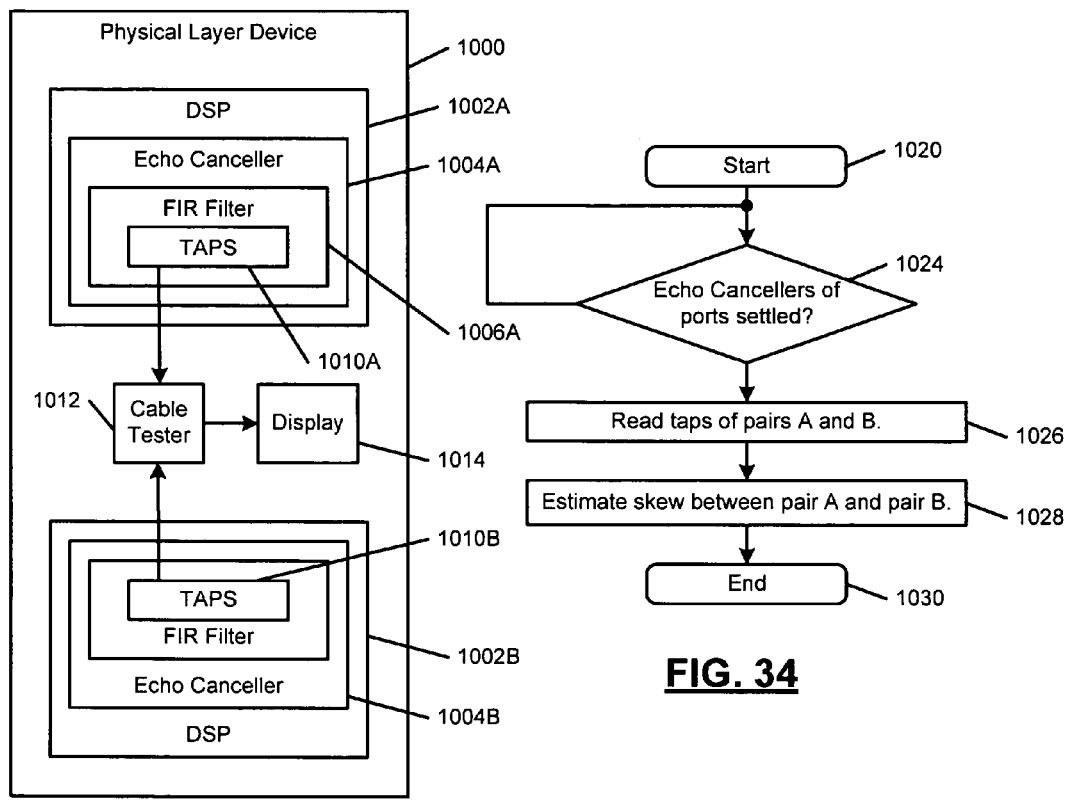
FIG. 33 is a functional block diagram of cable test module that estimates skew between pairs.
FIG. 34 illustrates steps that are performed by the cable test module to estimate skew.

Referring now to FIG. 33, the cable test module of a physical layer device 1000 is used to calculate skew. The physical layer device 1000 includes DSPs 1002A and 1002B that are associated with pairs A and B. As can be appreciated, additional pairs C and D can also be provided. The DSPs 1002A and 1002B include echo cancellers 1004A and 1004B, respectively, which include FIR filters 1006A and 1006B with taps 1010A and 1010B, respectively. After settling of the echo cancellers 1004A and 1004B, the values of the respective taps 1010A and 1010B are used to calculate skew between the pairs. In other words, the difference in the location of tap values is related to skew.

Referring now to FIG. 34, the steps for calculating skew are shown. Control begins in step 1020. In step 1024, control determines whether the echo cancellers 1004A and 1004B have settled. If not, control loops back to step 1024. If step 1024 is true, control continues with step 1026 and reads the values of the taps 1010A and 1010B of the echo cancellers 1004A and 1004B, respectively. In step 1028, control estimates the skew between the pairs A and B. Control ends in step 1030. As can be appreciated, skew can be calculated between additional pairs (A and C, A and D, B and D, and C and D) if desired.

Figure 35:
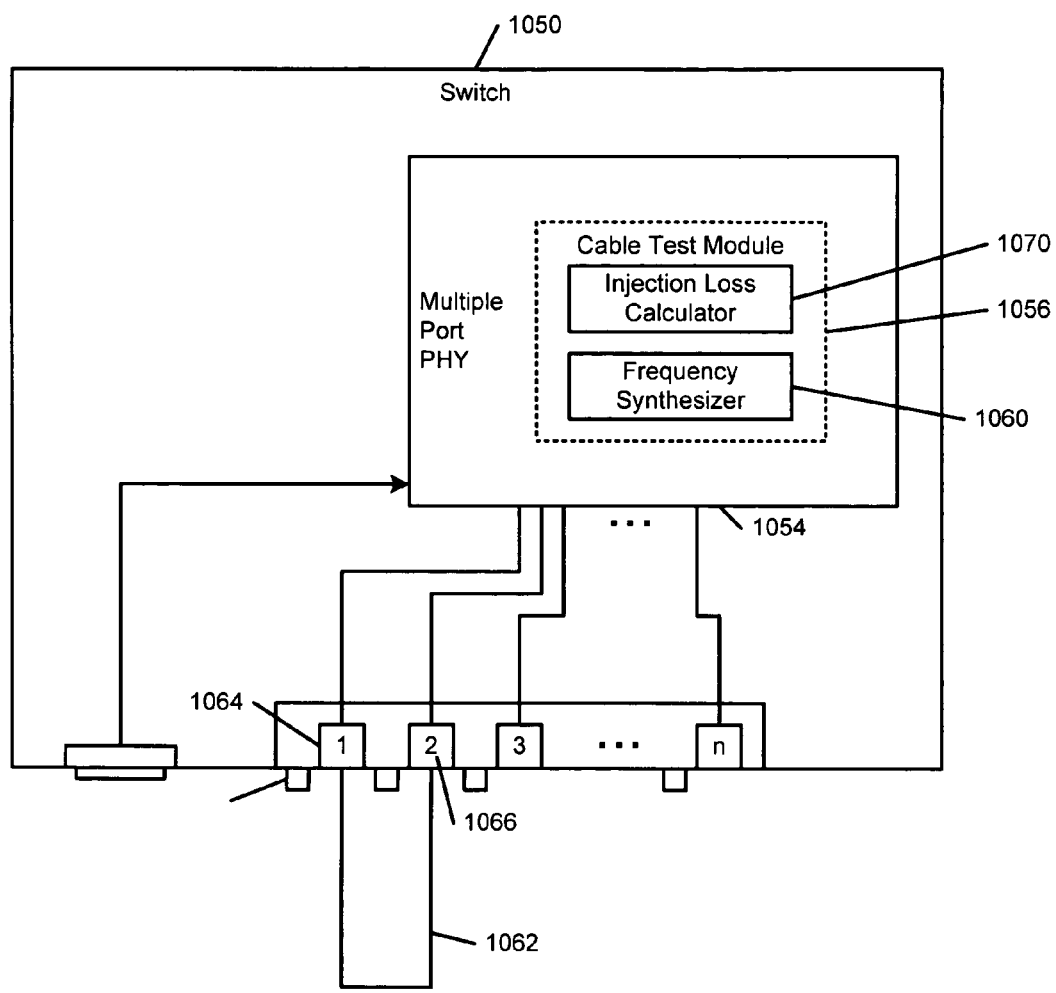
FIGS. 35 and 36 is a functional block diagram of a cable test module in a multiple port network device with an integrated frequency synthesizer and an insertion loss estimator.
Figure 36:
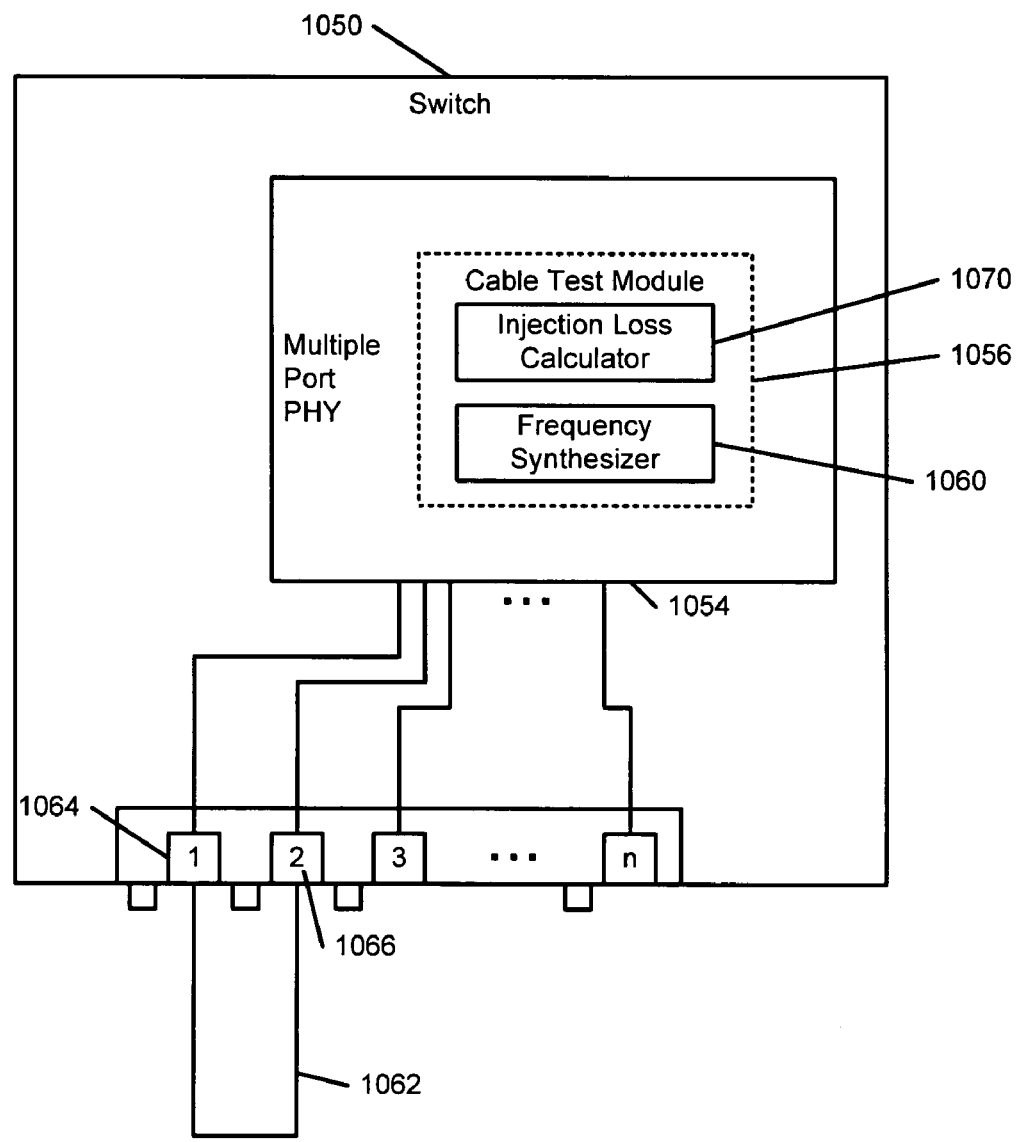

Referring now to FIGS. 35 and 36, the cable test module calculates insertion loss using a frequency synthesizer according to the present invention. A switch 1050 includes a multiple port physical layer device 1054 with a cable test module 1056. The cable test module 1056 includes a frequency synthesizer 1060 that selectively generates tones that are output onto a cable 1062. The cable test module 1056 also receives the generated tones at the opposite end of the cable 1062. In other words, the cable 1062 has one end that is connected to a first port 1064 and an opposite end that is connected to another port 1066 of the switch 1050. The cable test module 1056 includes an insertion loss calculator 1070 that calculates insertion loss as a function of frequency. In FIG. 35, a switch triggers the cable test. In FIG. 36, the cable test is triggered at power on and/or in other circumstances described above.

Figure 37A:
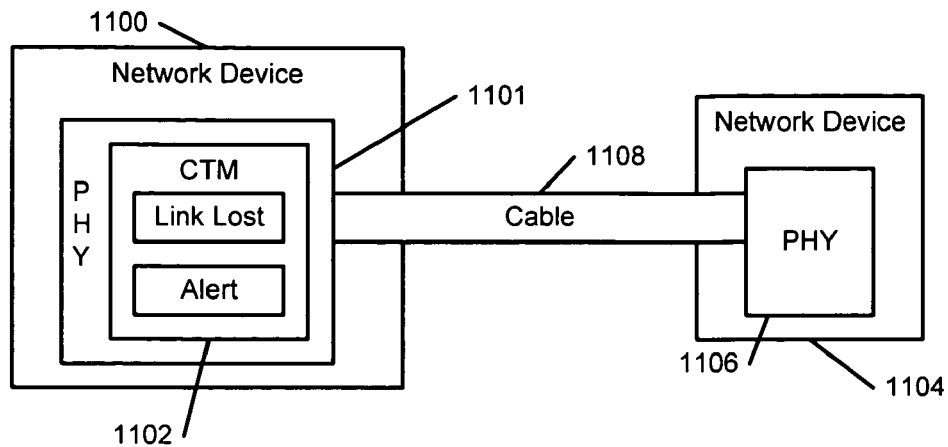
FIG. 37A is a functional block diagram of a cable disconnect detector using the cable test module.
Figure 37B:
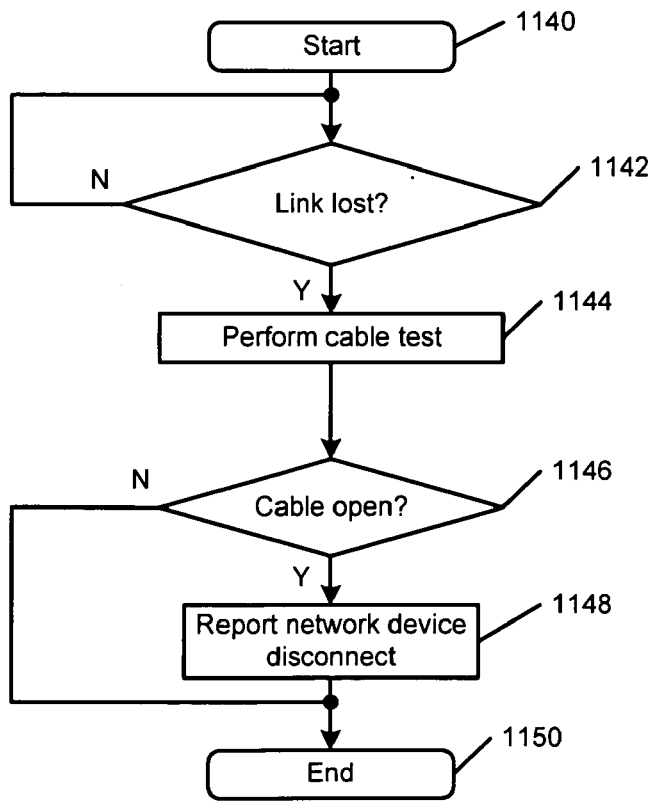
FIG. 37B illustrates steps that are performed by the cable disconnect detector in FIG. 37A.

Referring now to FIGS. 37A and 37B, a first network device 1100 includes a physical layer device 1101 with a cable test module 1102. The cable test module 1102 is used to identify when a second network device 1104 with a physical layer device 1106 is disconnected from the cable 1108. In FIG. 37B, control begins with step 1140. In step 1142, control determines whether a link between the network devices 1100 and 1104 is lost. If not, control returns to step 1142. Otherwise, control performs the cable test in step 1144. In step 1146, control determines whether the cable status is open. If true, control reports a disconnected network device and control ends in step 1150. If false, control ends without reporting, or control may report that the network device is connected. The network device 1100 can be a switch, a router or other multiport device that reports the disconnection of one device to one or more other connected devices. As can be appreciated, by reporting the occurrence of disconnections, network security can be maintained. The cable test can be delayed for a predetermined amount of time after the link is lost using a timer if desired.

The lookup tables disclosed herein can be implemented in software. If implemented in software, the lookup tables can be updated and/or changed after manufacture to accommodate other types of cable such as CAT 6, CAT 7, etc. The updates can be made using any conventional data transfer method. Removable media such as smart chips can also be used. To reduce the cost of implementing the lookup tables disclosed herein, one or more fixed thresholds or simple mathematical relationships can be used to reduce the cost of the cable tester. While the results will be somewhat less reliable, the implementation costs will be significantly reduced.

The cable test device can be implemented in a physical layer device of an Ethernet network device. The Ethernet network device is preferably an 802.3 ab compliant device which can operate in 10 Megabits per second (Mbps), 100 Mbps and/or 1000 Mbps modes depending upon characteristics of the link and/or link partners.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A physical layer device that communicates over a cable, comprising:
    a cable tester that determines a cable status, which includes an open status, a short status and a normal status, wherein said cable tester includes:
        a pretest module that senses activity on the cable and selectively enables testing based on said sensed activity; and
        a test module that is enabled by said pretest module, that transmits a test pulse on the cable, that measures a reflection amplitude, that calculates a cable length, and that determines said cable status based on said measured amplitude and said calculated cable length;
    a first digital signal processor (DSP) that communicates with a first pair of the cable and that includes a first echo canceller having a finite impulse response (FIR) filter with taps and a first crosstalk canceller having a FIR filter with taps; and
    a second DSP that communicates with a second pair of the cable and that includes a second echo canceller having a FIR filter with taps and a second crosstalk canceller having a FIR filter with taps,
    wherein said cable tester calculates a distance to at least one of echo and crosstalk based on values of said taps of said first echo canceller and said second crosstalk canceller.

2. The physical layer device of claim 1 further comprising an indicator for displaying at least one of said status, said echo distance, said crosstalk distance, said calculated cable length and said measured reflection amplitude.

3. The physical layer device of claim 1 wherein said physical layer is implemented in a network device.

4. The physical layer device on claim 1 wherein said cable tester is integrated with said physical layer device in a single integrated circuit.

5. A physical layer device that communicates over a cable, comprising:
    cable testing means for determining a cable status, which includes an open status, a short status and a normal status, wherein said cable tester includes:
        pretest means for sensing activity on the cable and for selectively enabling testing based on said sensed activity;
        test means that is enabled by said pretest module, for transmitting a test pulse on the cable, for measuring a reflection amplitude, for calculating a cable length, and for determining said cable status based on said measured amplitude and said calculated cable length;
    first digital signal processor (DSP) means for communicating with a first pair of the cable and that includes a first echo canceller having a finite impulse response (FIR) filter with taps and a first crosstalk canceller having a FIR filter with taps; and
    second DSP means for communicating with a second pair of the cable and that includes a second echo canceller having a FIR filter with taps and a second crosstalk canceller having a FIR filter with taps,
    wherein said cable testing means calculates a distance to at least one of echo and crosstalk based on values of said taps of said first echo canceller and said second crosstalk canceller.

6. The physical layer device of claim 5 further comprising indicating means for displaying at least one of said status, said echo distance, said crosstalk distance, said calculated cable length and said measured reflection amplitude.

7. The physical layer device of claim 5 wherein said physical layer is implemented in a network device.

8. The physical layer device on claim 5 wherein said cable testing means is integrated with said physical layer device in a single integrated circuit.

9. A method of operating a physical layer device that communicates over a cable, comprising:
    determining a cable status, which includes an open status, a short status and a normal status, wherein said determining includes:
        sensing activity on the cable and selectively enabling testing based on said sensed activity;
        transmitting a test pulse on the cable;
        measuring a reflection amplitude;
        calculating a cable length;
        determining said cable status based on said measured amplitude and said calculated cable length;
    providing communications between a first digital signal processor (DSP) and a first pair of the cable, wherein the first DSP includes a first echo canceller having a finite impulse response (FIR) filter with taps and a first crosstalk canceller having a FIR filter with taps;
    providing communications between a second DSP and a second pair of the cable, wherein the second DSP includes a second echo canceller having a FIR filter with taps and a second crosstalk canceller having a FIR filter with taps; and
    calculating a distance to at least one of echo and crosstalk based on values of said taps of said first echo canceller and said second crosstalk canceller.

10. The method of claim 9 further comprising displaying at least one of said status, said echo distance, said crosstalk distance, said calculated cable length and said measured reflection amplitude.

* * * * *

UNITED STATES PATENT AND TRADEMARK OFFICE
CERTIFICATE OF CORRECTION

PATENT NO. : 7,026,825 B1
APPLICATION NO. : 11/129202
DATED : April 11, 2006
INVENTOR(S) : William Lo et al.

It is certified that error appears in the above-identified patent and that said Letters Patent is hereby corrected as shown below:

| | |
|---|---|
| Title Page 2: #56 Column 2, Line 8 | Under Other Publications, last reference beginning with "IEEE Computer Society, $4^{th}$ line, delete "betwteen" and insert --between-- |
| Column 7, Line 55: | Delete "10/10" and insert --10/100-- |
| Column 8, Line 2: | Delete "10/10" and insert --10/100-- |
| Column 8, Line 25: | Delete "refection" and insert --reflection-- |
| Column 8, Line 29: | Delete "refection" and insert --reflection-- |
| Column 9, Line 12: | Delete "refection" and insert --reflection-- |
| Column 9, Line 15: | Delete "refection" and insert --reflection-- |
| Column 11, Line 34: | Delete "Is" and insert --If-- |
| Column 18, Line 8: | Delete "impendence" and insert --impedance-- |
| Column 19, Line 65: | Delete "on" and insert --of-- |
| Column 20, Line 34: | Delete "on" and insert --of-- |

Signed and Sealed this

Twelfth Day of December, 2006

JON W. DUDAS
*Director of the United States Patent and Trademark Office*